(12) United States Patent
Sato

(10) Patent No.: US 11,503,240 B2
(45) Date of Patent: Nov. 15, 2022

(54) SOLID-STATE IMAGE PICKUP ELEMENT, ELECTRONIC APPARATUS, AND METHOD OF CONTROLLING SOLID-STATE IMAGE PICKUP ELEMENT

(71) Applicant: Sony Semiconductor Solutions Corporation, Kanagawa (JP)

(72) Inventor: Mamoru Sato, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 181 days.

(21) Appl. No.: 16/976,372

(22) PCT Filed: Jan. 10, 2019

(86) PCT No.: PCT/JP2019/000552
§ 371 (c)(1),
(2) Date: Aug. 27, 2020

(87) PCT Pub. No.: WO2019/193801
PCT Pub. Date: Oct. 10, 2019

(65) Prior Publication Data
US 2021/0051285 A1 Feb. 18, 2021

(30) Foreign Application Priority Data
Apr. 4, 2018 (JP) .............................. JP2018-072434

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14612* (2013.01); *H01L 27/14636* (2013.01);
(Continued)

(58) Field of Classification Search
CPC .... H04N 5/378; H04N 5/37457; H04N 5/343; H04N 5/3745; H04N 5/37452;
(Continued)

(56) References Cited

U.S. PATENT DOCUMENTS 5,541,402 A * 7/1996 Ackland ............ H04N 5/37452
348/E3.018
2009/0268050 A1* 10/2009 Tashiro ................. H04N 5/363
348/222.1
2015/0214260 A1* 7/2015 Inui ................... H01L 27/14603
257/222

FOREIGN PATENT DOCUMENTS

JP 2008-271280 A 11/2008
JP 2013-225774 A 10/2013
WO 2013/111629 A1 8/2013

* cited by examiner

Primary Examiner — Albert H Cutler
(74) Attorney, Agent, or Firm — Michael Best & Friedrich LLP

(57) ABSTRACT

Provided is a solid-state image pickup element that amplifies the difference between respective signals of a pair of pixels and enables a reduction in the number of wiring lines.
The solid-state image pickup element includes an electric-charge accumulation unit, a reference reset transistor, and a readout reset transistor. The electric-charge accumulation unit accumulates electric charge transferred from a photo-electric conversion unit and generates signal voltage corresponding to the amount of the electric charge. The reference reset transistor supplies predetermined reset voltage to the electric-charge accumulation unit in a case of generating predetermined reference voltage. The readout reset transistor supplies voltage different from the reset voltage to the electric-charge accumulation unit in a case of reading out the signal voltage.

19 Claims, 24 Drawing Sheets

(51) Int. Cl.
 *H04N 5/3745* (2011.01)
 *H04N 5/343* (2011.01)
 *H01L 27/148* (2006.01)
(52) U.S. Cl.
 CPC .. *H01L 27/14643* (2013.01); *H01L 27/14831* (2013.01); *H04N 5/37457* (2013.01)
(58) Field of Classification Search
 CPC ......... H01L 27/14612; H01L 27/14636; H01L 27/14643; H01L 27/14831
 See application file for complete search history.

SOLID-STATE IMAGE PICKUP ELEMENT, ELECTRONIC APPARATUS, AND METHOD OF CONTROLLING SOLID-STATE IMAGE PICKUP ELEMENT

TECHNICAL FIELD

The present technology relates to a solid-state image pickup element, an electronic apparatus, and a method of controlling the solid-state image pickup element. The present technology particularly relates to a solid-state image pickup element that performs differential amplification, an electronic apparatus, and a method of controlling the solid-state image pickup element.

BACKGROUND ART

In order to make an enhancement in sensitivity, for example, in image shooting at a dark place, conventionally, used is a differential-amplification-type solid-state image pickup element that amplifies the difference between respective signals of a pair of pixels (namely, differential amplification). For example, a solid-state image pickup element has been proposed, in which a pair of pixels is connected to a current mirror circuit, and a circuit including the pair of pixels and the current mirror circuit functions as a differential amplifier circuit (for example, refer to Patent Document 1). In this differential amplifier circuit, one of the pair of pixels is used as a reference pixel and the other is used as a signal pixel. Then, at the time of image capturing, the reference pixel is initialized by reset voltage supplied through a vertical reset input line, and the signal pixel is initialized by power-source voltage. Lowering the reset voltage below the power-source voltage causes a larger signal amplitude, so that sensitivity can be improved.

CITATION LIST

Patent Document

Patent Document 1: Japanese Patent Application Laid-Open No. 2008-271280

SUMMARY OF THE INVENTION

Problems to be Solved by the Invention

According to the conventional technology, a higher sensitivity can be achieved with differential amplification compared to a case with no differential amplification. However, according to the configuration, in a case where the reference pixel and the signal pixel are switched at the time of image capturing, the vertical reset input line needs arranging to both of the pair of pixels, resulting in an increase in the number of wiring lines. Due to the increase in the number of wiring lines, in a case where wiring cannot be located within the pitch between pixels, a metallic layer needs to be added. Thus, increase is likely to occur in manufacturing cost. Meanwhile, if the reference pixel and the signal pixel are not switched around, only the reference pixel needs wiring for the vertical reset input line. However, such a configuration is undesirable because a pixel signal cannot be read out from the reference pixel.

The present technology has been made in consideration of such a situation. An object of the present technology is to provide a solid-state image pickup element that amplifies the difference between respective signals of a pair of pixels and enables a reduction in the number of wiring lines.

Solutions to Problems

The present technology has been made in order to solve the problems. According to a first aspect of the present technology, provided are a solid-state image pickup element and a method of controlling the solid-state image pickup element, the solid-state image pickup element including: an electric-charge accumulation unit configured to accumulate electric charge transferred from a photoelectric conversion unit, and generate signal voltage corresponding to an amount of the electric charge; a reference reset transistor configured to supply predetermined reset voltage to the electric-charge accumulation unit in a case of generating predetermined reference voltage; and a readout reset transistor configured to supply voltage different from the reset voltage to the electric-charge accumulation unit in a case of reading out the signal voltage. This arrangement has an effect in that the electric-charge accumulation unit is initialized by the reset voltage or the voltage different from the reset voltage.

Furthermore, in the first aspect, two reference reset transistors may be provided in the each electric-charge accumulation unit, and the two reference reset transistors may be connected in series between a vertical reset input line connected with a terminal of the reset voltage and the electric-charge accumulation unit. This arrangement has an effect in that the electric-charge accumulation unit is initialized by the reset voltage supplied by the two reference reset transistors.

Furthermore, in the first aspect, the readout reset transistor may be connected in parallel to either of the two reference reset transistors at a connection point between the two reference reset transistors. This arrangement has an effect in that the electric-charge accumulation unit is initialized by the reset voltage or the voltage different from the reset voltage supplied by the readout reset transistor and the reference reset transistor connected in parallel.

Furthermore, in the first aspect, two readout reset transistors may be provided in the each electric-charge accumulation unit, and the two reference reset transistors may be connected in series between a vertical reset input line connected with a terminal of the reset voltage and the electric-charge accumulation unit. This arrangement has an effect in that the electric-charge accumulation unit is initialized by the voltage supplied by the two readout reset transistors.

Furthermore, in the first aspect, the electric-charge accumulation unit, the reference reset transistor, and the readout reset transistor may be arranged in each of a pair of pixels arrayed in a vertical direction orthogonal to a predetermined direction, the respective reference reset transistors of the pair of pixels may be both connected with a vertical reset input line arranged in the vertical direction, the readout reset transistor in one of the pair of pixels may be connected with one of a pair of vertical signal lines arranged in the vertical direction, the readout reset transistor in another one of the pair of pixels may be connected with another one of the pair of vertical signal lines, the vertical reset input line may be connected with a terminal of the reset voltage, and the pair of vertical signal lines may be connected to a terminal of power-source voltage through a current mirror circuit. This arrangement has an effect in that the signal voltage is read out from the one of the pair of pixels.

Furthermore, in the first aspect, the pair of pixels each can further include: a transfer transistor configured to transfer the electric charge from the photoelectric conversion unit to the electric-charge accumulation unit, in accordance with a transfer signal; an amplification transistor configured to amplify the signal voltage; and a selection transistor configured to output the amplified signal voltage to the vertical signal line, in accordance with a selection signal. This arrangement has an effect in that the amplified signal voltage is output from the vertical signal line.

Furthermore, in the first aspect, the readout reset transistor may connect a connection node between the corresponding vertical signal line from the pair of vertical signal lines and the selection transistor to the electric-charge accumulation unit. This arrangement has an effect in that the electric-charge accumulation unit is initialized by the power-source voltage supplied through the vertical signal line.

Furthermore, in the first aspect, the readout reset transistor may connect a connection node between the selection transistor and the amplification transistor to the electric-charge accumulation unit. This arrangement has an effect in that the electric-charge accumulation unit is initialized by the power-source voltage supplied through the vertical signal line and the selection transistor.

Furthermore, in the first aspect, the solid-state image pickup element can further include a vertical drive unit configured to drive each of the pair of pixels in sequence to read out the signal voltage. This arrangement has an effect in that the signal voltage is read out in sequence from the pair of pixels.

Furthermore, in the first aspect, the vertical drive unit may select a pair of lines adjacent to each other from a plurality of lines each including pixels arrayed in the predetermined direction, and may read out the signal voltage in sequence from both of the pair of lines. This arrangement has an effect in that the signal voltage is read out in sequence from the pair of lines.

Furthermore, in the first aspect, the vertical drive unit may read out the signal voltage from any of a plurality of lines each including pixels arrayed in the predetermined direction, and may cause generation of the reference voltage in a line at a predetermined relative position to the corresponding line. This arrangement has an effect in that the reference voltage is generated in the line at the predetermined relative position to the readout line.

Furthermore, according to a second aspect of the present technology, provided is an electronic apparatus including: an electric-charge accumulation unit configured to accumulate electric charge transferred from a photoelectric conversion unit, and generate signal voltage corresponding to an amount of the electric charge; a reference reset transistor configured to supply predetermined reset voltage to the electric-charge accumulation unit in a case of generating predetermined reference voltage; a readout reset transistor configured to supply voltage different from the reset voltage to the electric-charge accumulation unit in a case of reading out the signal voltage; and a signal processing unit configured to process a signal of the signal voltage. This arrangement has an effect in that the electric-charge accumulation unit is initialized by the reset voltage or the voltage different from the reset voltage and the signal of the signal voltage is processed.

Effects of the Invention

The present technology has an excellent effect in that a reduction can be made in the number of wiring lines in a solid-state image pickup element that amplifies the difference between respective signals of a pair of pixels. Note that the effect herein is not necessarily limitative and thus any of the effects in the present disclosure may be provided.

MODE FOR CARRYING OUT THE INVENTION

Modes for carrying out the present technology (hereinafter, referred to as embodiments) will be described below. The descriptions will be given in the following order.
1. First Embodiment (Example of Arranging Two Reset Transistors in Pixel)
2. Second Embodiment (Example of Arranging Four Reset Transistors in Pixel)
3. Third Embodiment (Example of Arranging Three Reset Transistors in Pixel)
4. Modification
5. Configuration of Electronic Apparatus
6. Configuration of Solid-State Image Pickup Device
7. Application to Movable Object 1. First Embodiment

[Exemplary Configuration of Solid-State Image Pickup Element]

Figure 1:
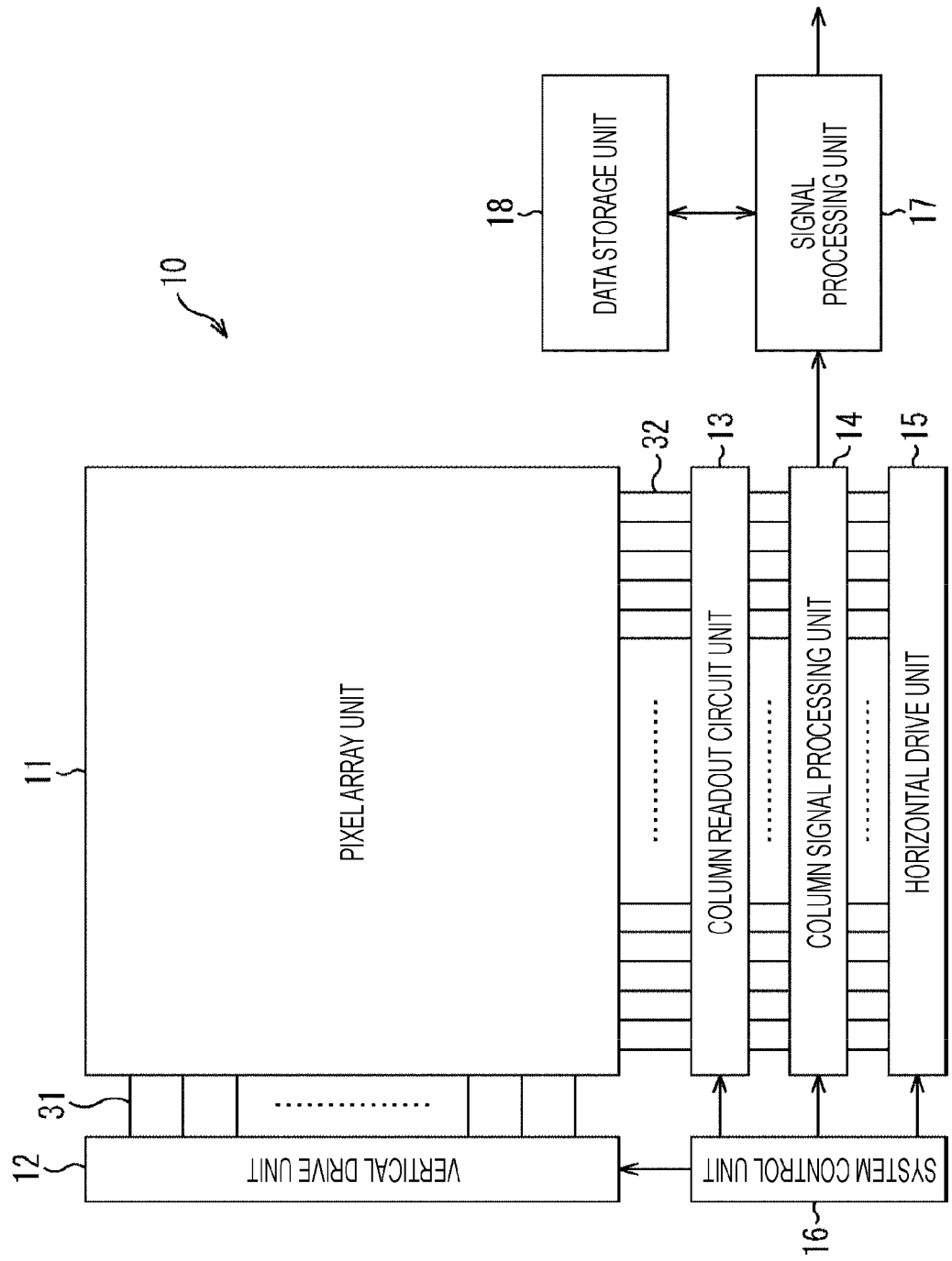
FIG. 1 is a block diagram of an exemplary configuration of a complementary MOS (CMOS) image sensor according to a first embodiment of the present technology.

FIG. 1 is a block diagram of an exemplary configuration of a CMOS image sensor 10 according to a first embodiment of the present technology. The CMOS image sensor 10 includes a pixel array unit 11, a vertical drive unit 12, a column readout circuit unit 13, a column signal processing unit 14, a horizontal drive unit 15, a system control unit 16, a signal processing unit 17, and a data storage unit 18. The pixel array unit 11, the vertical drive unit 12, the column readout circuit unit 13, the column signal processing unit 14, the horizontal drive unit 15, the system control unit 16, the signal processing unit 17, and the data storage unit 18 are formed on the same semiconductor substrate (chip) or on a plurality of semiconductor substrates (chips) layered in electrical connection. Note that the CMOS image sensor 10 is an exemplary solid-state image pickup element in the claims.

The pixel array unit 11 has unit pixels two-dimensionally arranged in a matrix, each unit pixel having a photoelectric conversion element capable of accumulating an amount of electric charge corresponding to the amount of incident light due to photoelectric conversion, inside and outputting electric charge as a signal (hereinafter, referred to as an effective unit pixel). Furthermore, in addition to the effective unit pixels, in some cases, the pixel array unit 11 includes a region in which dummy unit pixels and light-shielding unit pixels are two-dimensionally arranged in a matrix. The dummy unit pixels each have a structure of not having any photodiode that performs photoelectric conversion, and the light-shielding unit pixels are each equivalent to an effective pixel except that the light-shielding unit pixels each prevent external light from entering with a light-receiving face shielded from light.

Note that, hereinafter, in some cases, photoelectric charge having an amount of electric charge corresponding to the amount of incident light is simply described as "electric charge", and a unit pixel is simply described as a "pixel".

The pixel array unit 11 further has a pixel drive line 31 formed along the left-and-right direction of the figure in every row of the pixel array in a matrix (array direction of the pixels in each pixel row) and a vertical pixel wiring line 32 formed along the up-and-down direction of the figure in every column (array direction of the pixels in each pixel column). One end of each pixel drive line 31 is in connection with the output end of the corresponding row of the vertical drive unit.

The column readout circuit unit 13 at least includes a circuit that supplies constant current to every column of the pixels in a selected row in the pixel array unit 11, a current mirror circuit for a high-gain amplifier, and a readout mode selection switch. The column readout circuit unit 13 forms an amplifier together with transistors in a selected pixel in the pixel array unit. The amplifier converts a photoelectric charge signal into a voltage signal and outputs the voltage signal to the vertical pixel wiring line 32.

The vertical drive unit 12 includes, for example, a shift register and an address decoder, and is a pixel drive unit that drives each of the pixels in the pixel array unit 11, for example, simultaneously or in units of rows. Although not illustrated in specific configuration, the vertical drive unit 12 has a readout scanning system and a sweep scanning system, or batch sweeping and batch transfer.

In order to read out a signal from each unit pixel, the readout scanning system selectively scans, in sequence, the unit pixels in the pixel array unit in units of rows. In row driving (rolling shutter operation), for sweeping, sweep scanning is performed to a readout row to which the readout scanning system performs readout scanning, prior to the readout scanning by a time needed in shutter speed. Furthermore, in global exposure (global shutter operation), batch sweeping is performed prior to batch transfer by a time needed in shutter speed. Due to such sweeping, unnecessary electric charge is swept out from the respective photoelectric conversion elements of the unit pixels in each readout row (reset). Then, due to the sweeping (resetting) of the unnecessary electric charge, so-called electronic shutter operation is performed. Here, the electronic shutter operation refers to an operation of discharging unnecessary photoelectric charge having remained in the photoelectric conversion elements until just before and starting exposure anew (starting accumulation of photoelectric charge). The signal read out by the readout operation of the readout scanning system corresponds to the amount of incident light after the previous readout operation or the electronic shutter operation. In row driving, the period from the readout timing of the previous readout operation or the sweep timing of the electronic shutter operation to the readout timing of the present readout operation is the accumulation time (exposure time) of photoelectric charge in the unit pixel. In global exposure, the time from batch sweeping to batch transfer is the accumulation time (exposure time).

The pixel signals output from the respective unit pixels in a pixel row selectively scanned by the vertical drive unit 12 are supplied to the column signal processing unit 14 through the corresponding vertical pixel wiring lines 32. The column signal processing unit 14 performs predetermined signal processing to the pixel signal output through the vertical pixel wiring line 32 from each unit pixel in the selected row for every pixel column in the pixel array unit. In addition, the column signal processing unit 14 temporarily retains the pixel signal subjected to the signal processing.

Specifically, the column signal processing unit 14 performs at least, as the signal processing, noise removal processing, such as correlated double sampling (CDS) processing. The column signal processing unit 14 performs correlated double sampling, resulting in removal of reset noise and fixed pattern noise unique to a pixel, such as the threshold deviation of an amplification transistor. Note that, in addition to the noise removal processing, for example, the column signal processing unit may have an analog-digital (AD) conversion function, so that a signal level can be output as a digital signal.

The horizontal drive unit 15 includes, for example, a shift register and an address decoder, and selects, in sequence, unit circuits corresponding to the pixel columns in the column signal processing unit. Due to the selective scanning of the horizontal drive unit 15, the pixel signals subjected to the signal processing by the column signal processing unit 14 are output in sequence to the signal processing unit 17.

The system control unit 16 includes, for example, a timing generator that generates various types of timing signals, and drive-controls, for example, the vertical drive unit 12, the column readout circuit unit 13, the column signal processing unit 14, and the horizontal drive unit 15, on the basis of the various types of timing signals generated by the timing generator.

The CMOS image sensor 10 further includes the signal processing unit 17 and the data storage unit 18. The signal processing unit 17 has at least an addition processing function, and performs various types of signal processing, such as addition processing, to the pixel signals output from the column signal processing unit.

In accordance with signal processing in the signal processing unit, the data storage unit 18 temporarily stores data necessary for the processing. Instead of the signal processing unit 17 and the data storage unit 18, an external signal processing unit, such as a digital signal processor (DSP) and software, provided on a substrate different from that of the CMOS image sensor 10 may perform processing. Alternatively, the external signal processing unit may be mounted on the same substrate of the CMOS image sensor 10.

[Exemplary Configuration of Pixel]

Figure 2:
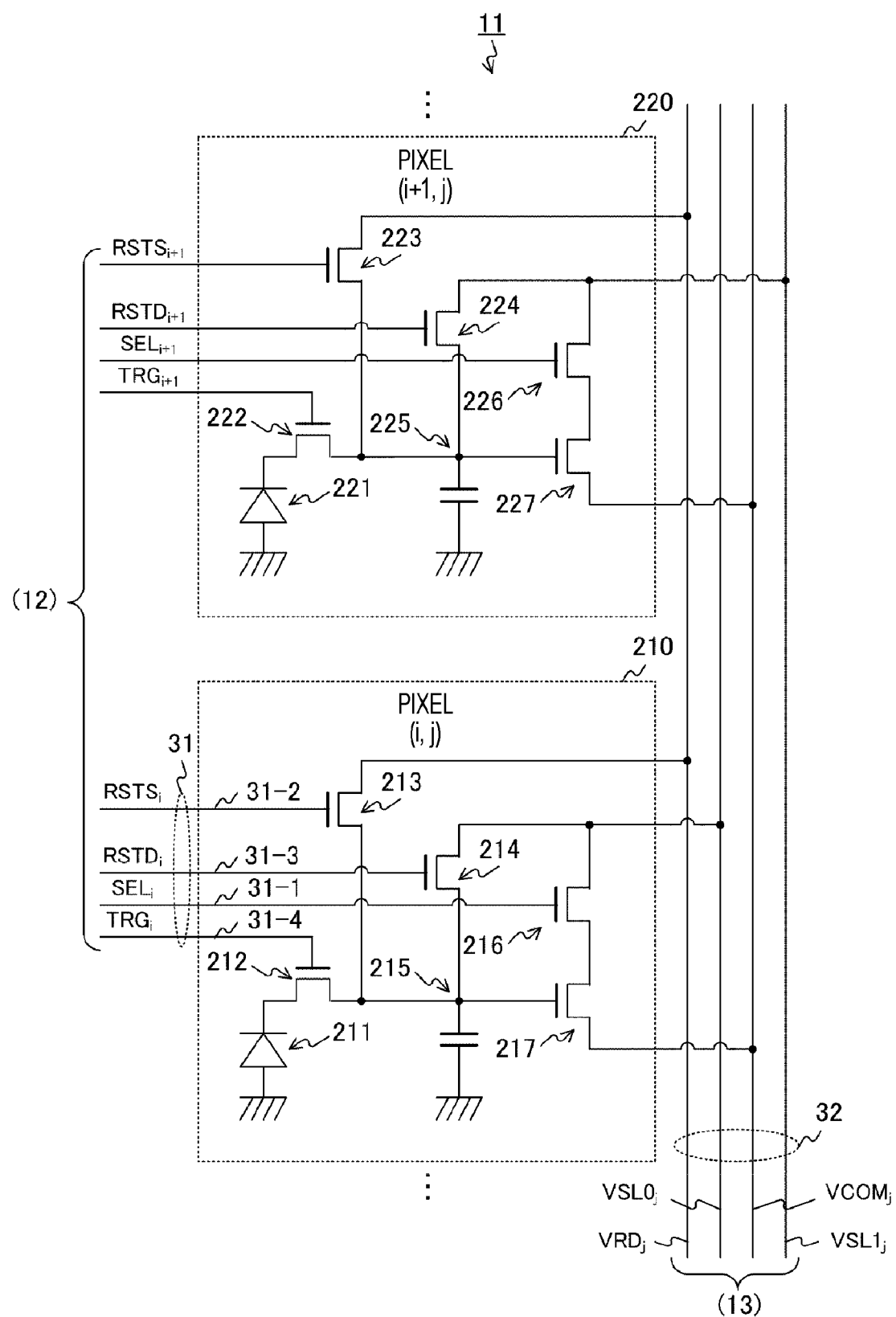
FIG. 2 is a circuit diagram of an exemplary configuration of pixels according to the first embodiment of the present technology.

FIG. 2 is a circuit diagram of an exemplary configuration of pixels 210 and 220 according to the first embodiment of the present technology. In the pixel array unit 11, a plurality of pixels, such as the pixels 210 and 220, is arrayed in a two-dimensional grid pattern. The pixel 210 is a pixel adjacent to the pixel 220. For example, the pixel 210 is arranged in an odd row, and the pixel 220 is arranged in an even row.

The pixel 210 includes a photodiode 211, a transfer transistor 212, a floating diffusion region 215, a reference reset transistor 213, a readout reset transistor 214, a selection transistor 216, and an amplification transistor 217. As each transistor, for example, a metal-oxide-semiconductor (MOS) transistor is used.

Furthermore, the pixel array unit 11 has the pixel drive line 31 arranged along the horizontal direction in each row, each pixel drive line 31 having the one end connected with the vertical drive unit 12. The pixel drive line 31 in each row includes a selection transistor drive line 31-1, a reference reset transistor drive line 31-2, a readout reset transistor drive line 31-3, and a transfer transistor drive line 31-4.

In addition, the pixel array unit 11 has the vertical pixel wiring line 32 arranged along the vertical direction in each column, each vertical pixel wiring line 32 having one end connected with the column readout circuit unit 13. The vertical pixel wiring line 32 in each column includes vertical signal lines $VSL0_j$ and $VSL1_j$, a vertical reset input line $VRD_j$, and a vertical current supply line $VCOM_j$. For example, when the number of columns is defined as J (J is an integer), the number of wiring lines in the vertical direction is 4×J. Note that the subscript j is an integer from 0 to J.

The anode of the photodiode 211 is grounded and the cathode of the photodiode 211 is in connection with the source of the transfer transistor 212. The drain of the transfer transistor 212 is in connection with the respective sources of the reference reset transistor 213 and the readout reset transistor 214 and the gate of the amplification transistor 217. The connection point therebetween is a constituent of the floating diffusion region 215.

Furthermore, the drain of the reference reset transistor 213 is in connection with the vertical reset input line $VRD_j$, and the drain of the readout reset transistor 214 is in connection with the vertical signal line $VSL0_j$. The source of the amplification transistor 217 is in connection with the vertical current supply line $VCOM_j$. The drain of the amplification transistor 217 is in connection with the source of the selection transistor 216, and the drain of the selection transistor 216 is in connection with the vertical signal line $VSL0_j$. The respective gates of the transfer transistor 212, the reference reset transistor 213, the readout reset transistor 214, and the selection transistor 216 are each in connection with the vertical drive unit 12 through the pixel drive line 31. A pulse as a drive signal is supplied to each of the transistors.

The pixel 220 includes a photodiode 221, a transfer transistor 222, a floating diffusion region 225, a reference reset transistor 223, a readout reset transistor 224, a selection transistor 226, and an amplification transistor 227. The configuration in connection of the elements is similar to that of the pixel 210 except that the readout reset transistor 224 is connected with the vertical signal line $VSL1_j$. The configurations of the pixels in the odd rows, except the pixel 210, are similar to that of the pixel 210, and the configurations of the pixels in the even rows, except the pixel 220, are similar to that of the pixel 220. That is the odd rows are connected with the vertical signal line $VSL0_j$ and the even rows are connected with the vertical signal line $VSL1_j$.

Next, the fundamental function of the pixel 210 will be described. In accordance with a drive signal $RSTS_i$ supplied from the vertical drive unit 12, the reference reset transistor 213 turns on/off of discharge of the electric charge accumulated in the floating diffusion region 215. Here, the number of rows is I (I is an integer), and the subscript i is an integer from 0 to I. For example, when the reference reset transistor 213 is supplied with the drive signal $RSTS_i$ high in level, the floating diffusion region 215 is clamped by voltage applied through the vertical reset input line $VRD_j$, resulting in discharge (reset) of the electric charge accumulated in the floating diffusion region 215.

Furthermore, when the reference reset transistor 213 is supplied with the drive signal $RSTS_i$ low in level, the floating diffusion region 215 is electrically disconnected from the vertical reset input line $VRD_j$, resulting in a floating state.

In accordance with a drive signal $RSTD_i$ supplied from the vertical drive unit 12, the readout reset transistor 214 forms a negative feedback circuit. For example, when the readout reset transistor 214 is supplied with the drive signal $RSTD_i$ high in level, the floating diffusion region 215 and the vertical signal line $VSL0_j$ are electrically connected together, resulting in formation of the negative feedback circuit (voltage follower circuit). In the circuit, the −input of the differential pair and the vertical signal line $VSL0_j$ are substantially equivalent in voltage level to the +input of the differential pair, resulting in discharge (reset) of the electric charge accumulated in the floating diffusion region of the signal pixel. Furthermore, when the readout reset transistor 214 is supplied with the drive signal $RSTD_i$ low in level, the floating diffusion region 215 is electrically disconnected from the vertical signal line $VSL0_j$, resulting in a floating state.

Meanwhile, the photodiode 211 performs photoelectric conversion to incident light, and generates and accumulates electric charge corresponding in amount to the incident light. In accordance with a drive signal $TRG_i$ supplied from the vertical drive unit 12, the transfer transistor 212 turns on/off of transfer of the electric charge from the photodiode 211 to the floating diffusion region 215. For example, when supplied with the drive signal $TRG_i$ high in level, the transfer transistor 212 transfers the electric charge accumulated in the photodiode 211 to the floating diffusion region 215. When supplied with the drive signal $TRG_i$ low in level, the transfer transistor 212 stops transferring the electric charge. Note that, while the transfer transistor 212 keeps stopping the transfer of the electric charge to the floating diffusion region 215, the photoelectrically converted electric charge is accumulated in the photodiode 211.

Note that the photodiode 211 is an exemplary photoelectric conversion unit in the claims.

The floating diffusion region 215 has a function of accumulating electric charge transferred from the photodiode 211 through the transfer transistor 212. In the floating state where the reference reset transistor 213 and the readout reset transistor 214 are off, the potential of the floating diffusion region 215 is modulated in accordance with the amount of electric charge accumulated. Note that the floating diffusion region 215 is an exemplary electric-charge accumulation unit in the claims.

The amplification transistor 217 acts as an amplifier with a variation in the potential of the floating diffusion region 215 connected with the gate thereof as an input signal. The output voltage signal is output to the vertical signal line $VSL0_j$ through the selection transistor 216.

In accordance with a drive signal $SEL_i$ supplied from the vertical drive unit 12, the selection transistor 216 turns on/off of the output of the voltage signal from the amplification transistor 217 to the vertical signal line. For example, when supplied with the drive signal $SEL_i$ high in level, the selection transistor 216 outputs the voltage signal to the vertical signal line $VSL0_j$. When supplied with the drive signal $SEL_i$ low in level, the selection transistor 216 stops outputting the voltage signal. This arrangement enables extraction of only the output of a selected pixel from the vertical signal line connected with the plurality of pixels.

As described above, the pixel 210 is driven in accordance with the drive signal $TRG_i$, the drive signals $RSTS_i$ and $RSTD_i$, and the drive signal $SEL_i$ supplied from the vertical drive unit.

Figure 3:
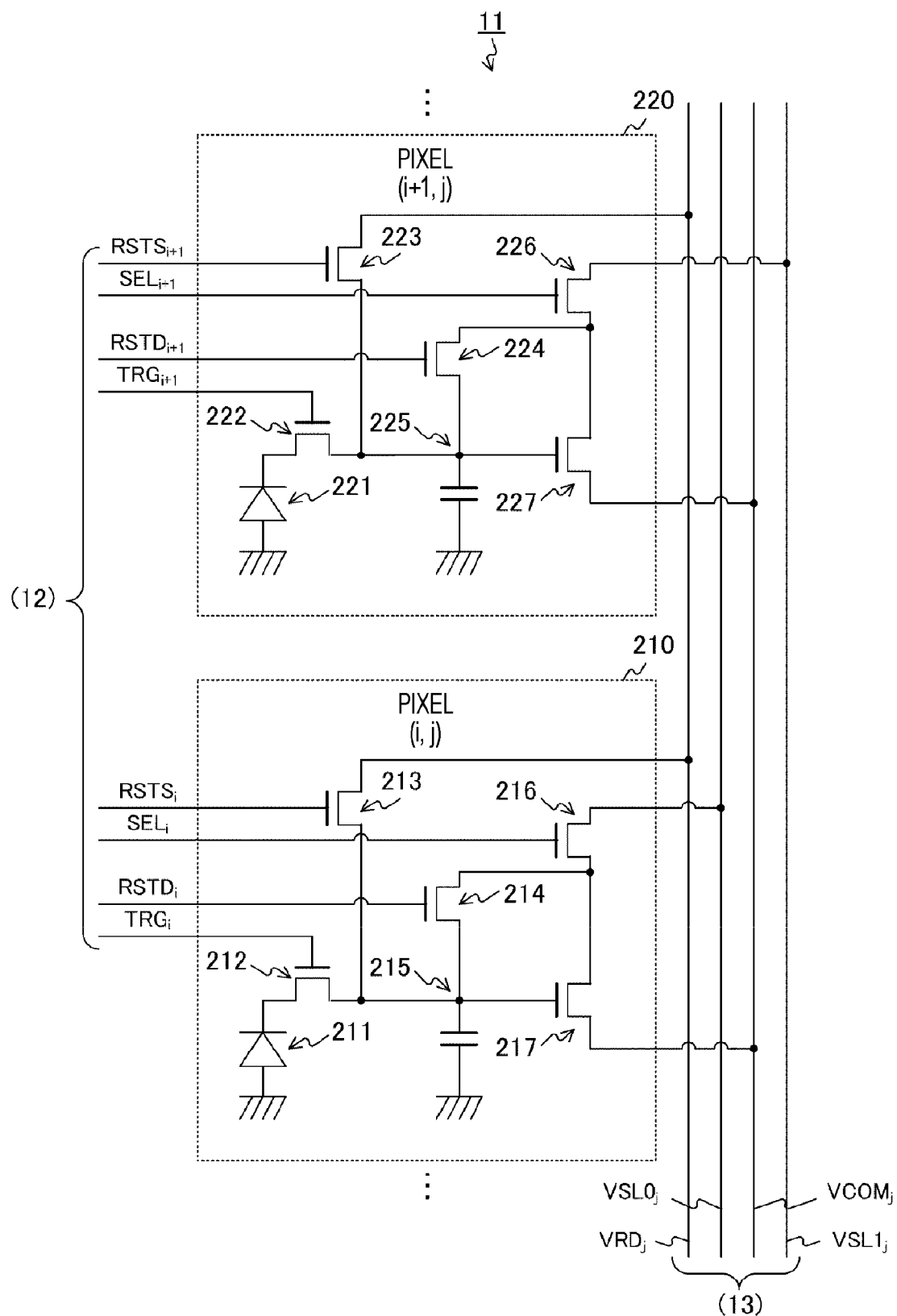
FIG. 3 is a circuit diagram of an exemplary configuration of the pixels with transistors changed in arrangement according to the first embodiment of the present technology.

Note that, although the drains of the readout reset transistor 214 and 224 are in direct connection with the vertical signal line $VSL0_j$, as exemplified in FIG. 3, the drains of the readout reset transistors 214 and 224 may be connected to the vertical signal line $VSL0_j$ through the selection transistors 216 and 226, respectively.

[Exemplary Configuration of Column Readout Circuit Unit]

Figure 4:
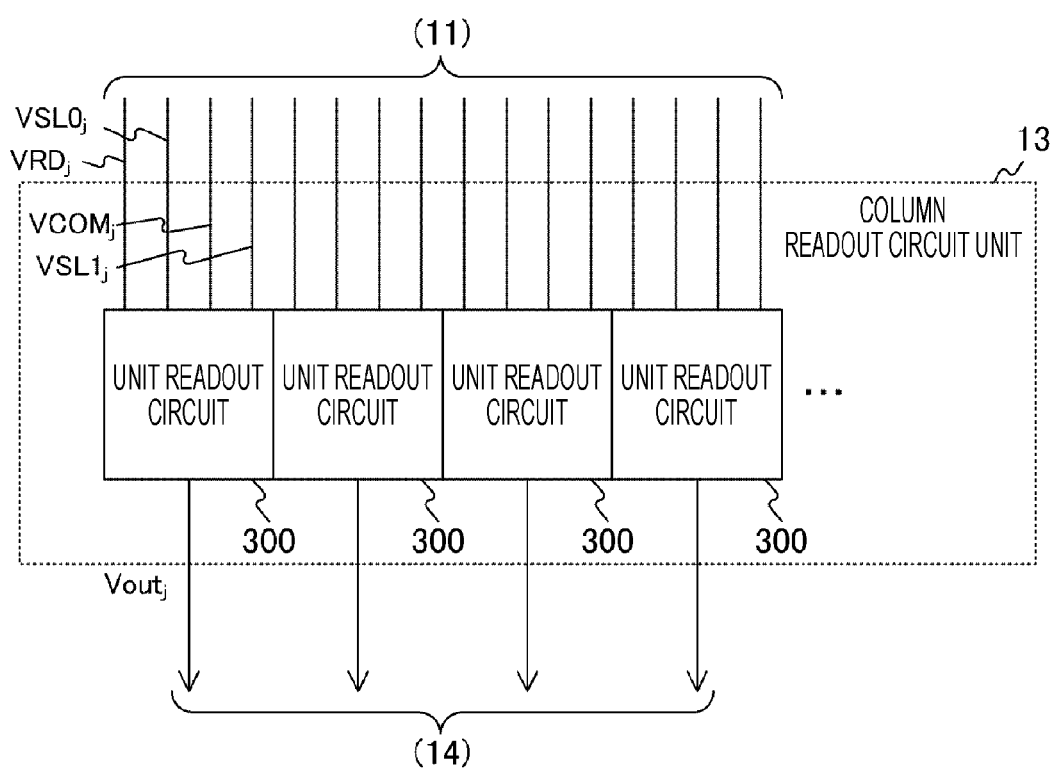
FIG. 4 is a block diagram of an exemplary configuration of a column readout circuit unit according to the first embodiment of the present technology.

FIG. 4 is a block diagram of an exemplary configuration of the column readout circuit unit 13 according to the first embodiment of the present technology. The column readout circuit unit 13 includes a unit readout circuit 300 arranged in every column. When the number of columns is defined as J, J number of unit readout circuits 300 are arranged.

Each unit readout circuit 300 is in connection with the pixel array unit 11 through the vertical signal lines $VSL0_j$ and $VSL1_j$, the vertical reset input line $VRD_j$, and the vertical current supply line $VCOM_j$. Furthermore, the unit readout circuits 300 each select one of the respective voltage signals from the vertical signal lines $VSL0_j$ and $VSL1_j$, and supplies, as a pixel signal $Vout_j$, the one to the column signal processing unit 14.

Figure 5:
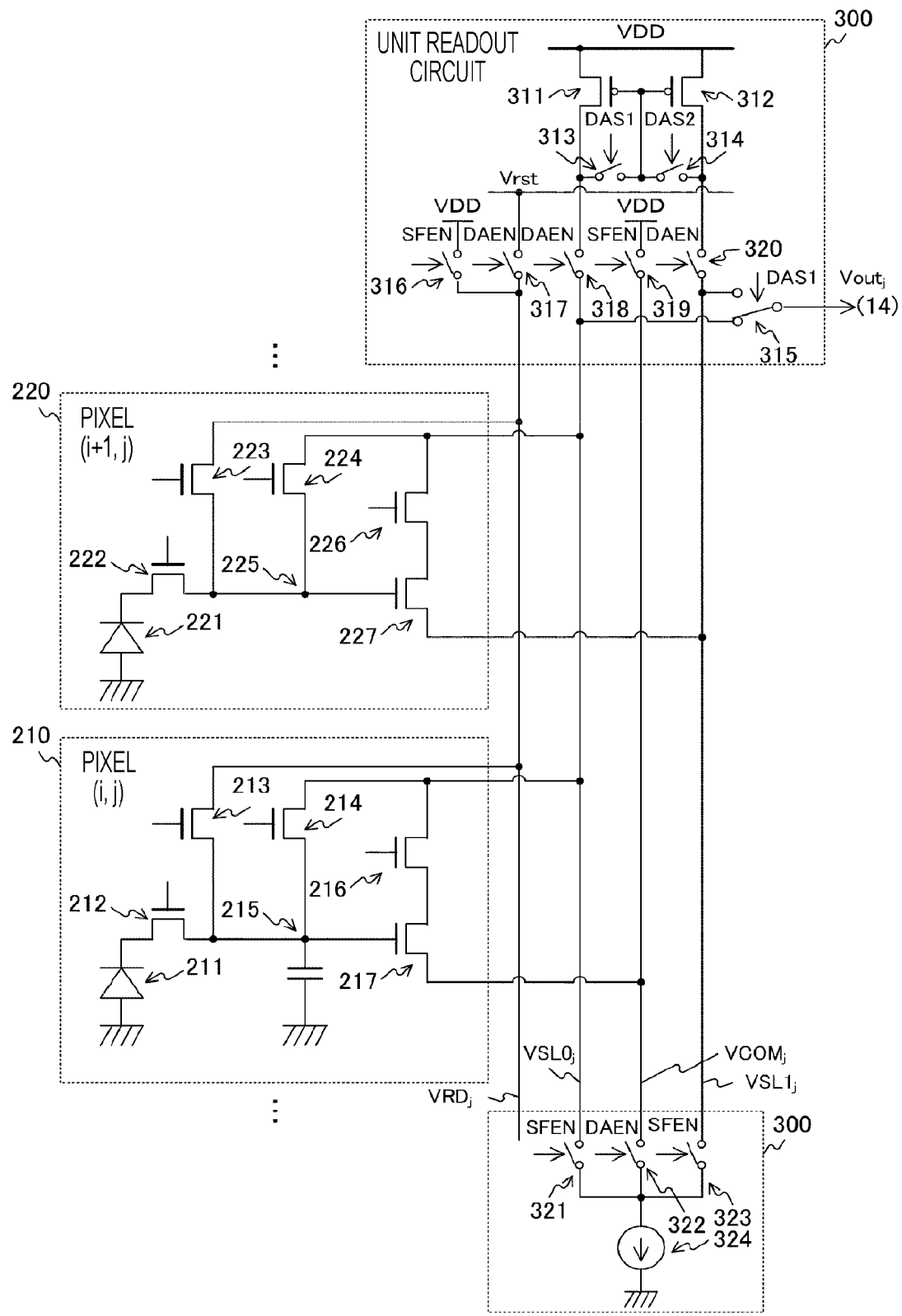
FIG. 5 is a circuit diagram of an exemplary configuration of a unit readout circuit and the pixels according to the first embodiment of the present technology.

FIG. 5 is a circuit diagram of an exemplary configuration of the unit readout circuit 300 and the pixels 210 and 220 according to the first embodiment of the present technology. The unit readout circuit 300 includes P-type transistors 311 and 312, switches 313 to 323, and a current source 324. As the P-type transistors 311 and 312, for example, MOS transistors are used. The P-type transistors 311 and 312 are connected, in parallel, with the terminal of power-source voltage VDD, and the gates thereof are connected together.

The switch 313 makes a short circuit between the gate and the drain of the P-type transistor 311, in accordance with a drive signal DAS1 from the system control unit 16. For example, in a case where the drive signal DAS1 is high in level, the switch 313 transitions to the on-state, so that a short circuit is made between the gate and the drain of the P-type transistor 311.

The switch 314 makes a short circuit between the gate and the drain of the P-type transistor 312, in accordance with a drive signal DAS2 from the system control unit 16. For example, in a case where the drive signal DAS2 is high in level, the switch 314 transitions to the on-state, so that a short circuit is made between the gate and the drain of the P-type transistor 312.

Transition of one of the switches 313 and 314 to the on-state and transition of the other to the off-state causes the P-type transistors 311 and 312 to function as a current mirror circuit.

The switch 315 selects one of the vertical signal lines $VSL0_j$ and $VSL1_j$ and connects the one to the column signal processing unit 14, in accordance with the drive signal DAS1 from the system control unit 16. For example, in a case where the drive signal DAS1 is high in level, the vertical signal line $VSL1_j$ is selected. In a case where the drive signal DAS1 is low in level, the vertical signal line $VSL0_j$ is selected.

The switch 316 connects the terminal of the power-source voltage VDD to the vertical reset input line $VRD_j$, in accordance with a drive signal SFEN from the system control unit 16. For example, in a case where the drive signal SFEN is high in level, the power-source voltage VDD is connected to the vertical reset input line $VRD_j$.

The switch 317 connects the terminal of reset voltage Vrst different from the power-source voltage VDD to the vertical reset input line $VRD_j$, in accordance with a drive signal DAEN from the system control unit 16. For example, in a case where the drive signal DAEN is high in level, the reset voltage Vrst is connected to the vertical reset input line $VRD_j$.

Here, as the reset voltage Vrst, for example, voltage lower than the power-source voltage VDD is applied. For example, the power-source voltage VDD is 3.3 volts (V), and the reset voltage Vrst is 2.2 volts (V). A higher reset voltage Vrst gives an advantage in transfer of electric charge, so that a large amount of signal electric charge can be transferred. Meanwhile, a lower reset voltage Vrst enables an increase in the amplitude of output voltage. Note that, in a case where a photodiode inverse in polarity is provided, it is advantageous to set the reset voltage Vrst and the power-source voltage VDD inversely in potential to the above setting.

The switch 318 connects the P-type transistor 311 to the vertical signal line $VSL0_j$, in accordance with the drive signal DAEN from the system control unit 16. For example, in a case where the drive signal DAEN is high in level, the P-type transistor 311 is connected to the vertical signal line $VSL0_j$.

The switch 319 connects the terminal of the power-source voltage VDD to the vertical current supply line $VCOM_j$, in accordance with the drive signal SFEN from the system control unit 16. For example, in a case where the drive signal SFEN is high in level, the power-source voltage VDD is connected to the vertical current supply line $VCOM_j$.

The switch 320 connects the P-type transistor 312 to the vertical signal line $VSL1_j$, in accordance with the drive signal DAEN from the system control unit 16. For example, in a case where the drive signal DAEN is high in level, the P-type transistor 312 is connected to the vertical signal line $VSL1_j$.

The switch 321 connects the vertical signal line $VSL0_j$ to the current source 324, in accordance with the drive signal SFEN from the system control unit 16. For example, in a case where the drive signal SFEN is high in level, the vertical signal line $VSL0_j$ is connected to the current source 324.

The switch 322 connects the vertical current supply line $VCOM_j$ to the current source 324, in accordance with the drive signal DAEN from the system control unit 16. For example, in a case where the drive signal DAEN is high in level, the vertical current supply line $VCOM_j$ is connected to the current source 324.

The switch 323 connects the vertical signal line $VSL1_j$ to the current source 324, in accordance with the drive signal SFEN from the system control unit 16. For example, in a case where the drive signal SFEN is high in level, the vertical signal line $VSL1_j$ is connected to the current source 324.

According to the configuration, with the drive signal SFEN high in level and the drive signal DAEN low in level, the unit readout circuit 300 and the pixels 210 and 220 form a differential amplifier circuit. Hereinafter, this state is referred to as "differential mode".

Meanwhile, with the drive signal SFEN low in level and the drive signal DAEN high in level, the unit readout circuit 300 and the pixels 210 and 220 form a source follower circuit. Hereinafter, this state is referred to as "source follower (SF) mode".

In the differential mode, an increase in gain to an image signal enables a great increase in conversion efficiency. However, the operating point is narrow in range, and thus it is difficult to make an increase in dynamic range. Thus, the differential mode is suitable to image capturing in a dark place, and the SF mode is suitable to image capturing in a bright place. Thus, for example, in a case where the photometric quantity of ambient light is smaller than a predetermined threshold, the differential mode is set. In a case where the photometric quantity thereof is not less than the threshold, the SF mode is set.

Furthermore, in the differential mode, a pair of pixels arrayed in the vertical direction is selected, in which one of the pair of pixels is selected as a "signal pixel" and the other is selected as a "reference pixel". Among such pixels, the signal pixel is a pixel from which voltage corresponding to the amount of electric charge due to photoelectric conversion is read out as signal voltage. Meanwhile, the reference pixel has the voltage of the floating diffusion region initialized to predetermined reference voltage. In the differential mode, a signal resulting from amplification of the difference between the signal voltage and the reference voltage is read out.

Furthermore, in the differential mode, control of the drive signals DAS1 and DAS2 enables switching of the signal pixel and the reference pixel. For example, in a case where only the drive signal DAS1 is high in level from the drive signals DAS1 and DAS2, one of the pixels 210 and 220 is the signal pixel. Conversely, in a case where only the drive signal DAS2 is high in level, the other of the pixels 210 and 220 is the signal pixel.

[Exemplary Configuration of Column Signal Processing Unit]

Figure 6:
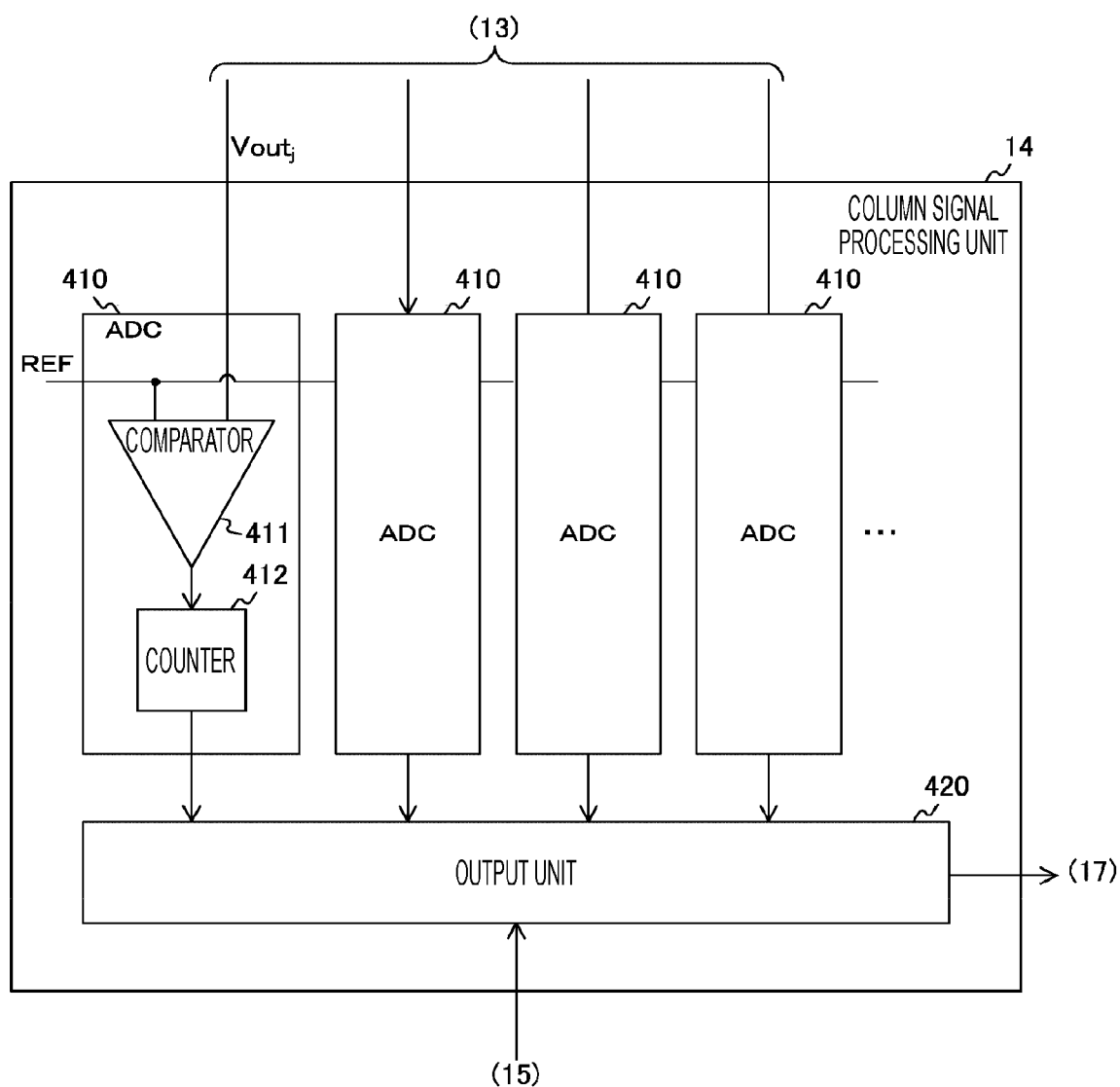
FIG. 6 is a block diagram of an exemplary configuration of a column signal processing unit according to the first embodiment of the present technology.

FIG. 6 is a block diagram of an exemplary configuration of the column signal processing unit 14 according to the first embodiment of the present technology. The column signal processing unit 14 includes a plurality of ADCs 410 and an output unit 420. The ADC 410 is arranged in each column. The analog pixel signal $Vout_j$ from the column readout circuit unit 13 is input to the j-th ADC 410.

The ADC 410 converts the input analog signal into a digital signal. The ADC 410 includes a comparator 411 and a counter 412.

The comparator 411 compares the input analog signal and a reference signal REF. As the reference signal REF, for example, a sawtooth ramp signal is used. The comparator 411 supplies a comparative result signal indicating a comparative result to the counter 412.

The counter 412 counts the count value of a period during which the comparative result signal remains at a predetermined level. The counter 412 supplies the digital signal indicating the count value as pixel data to the output unit 420.

The output unit 420 performs CDS processing, and then outputs each piece of pixel data, in sequence, to the signal processing unit 17 in accordance with the control of the horizontal drive unit 15.

Figure 7:
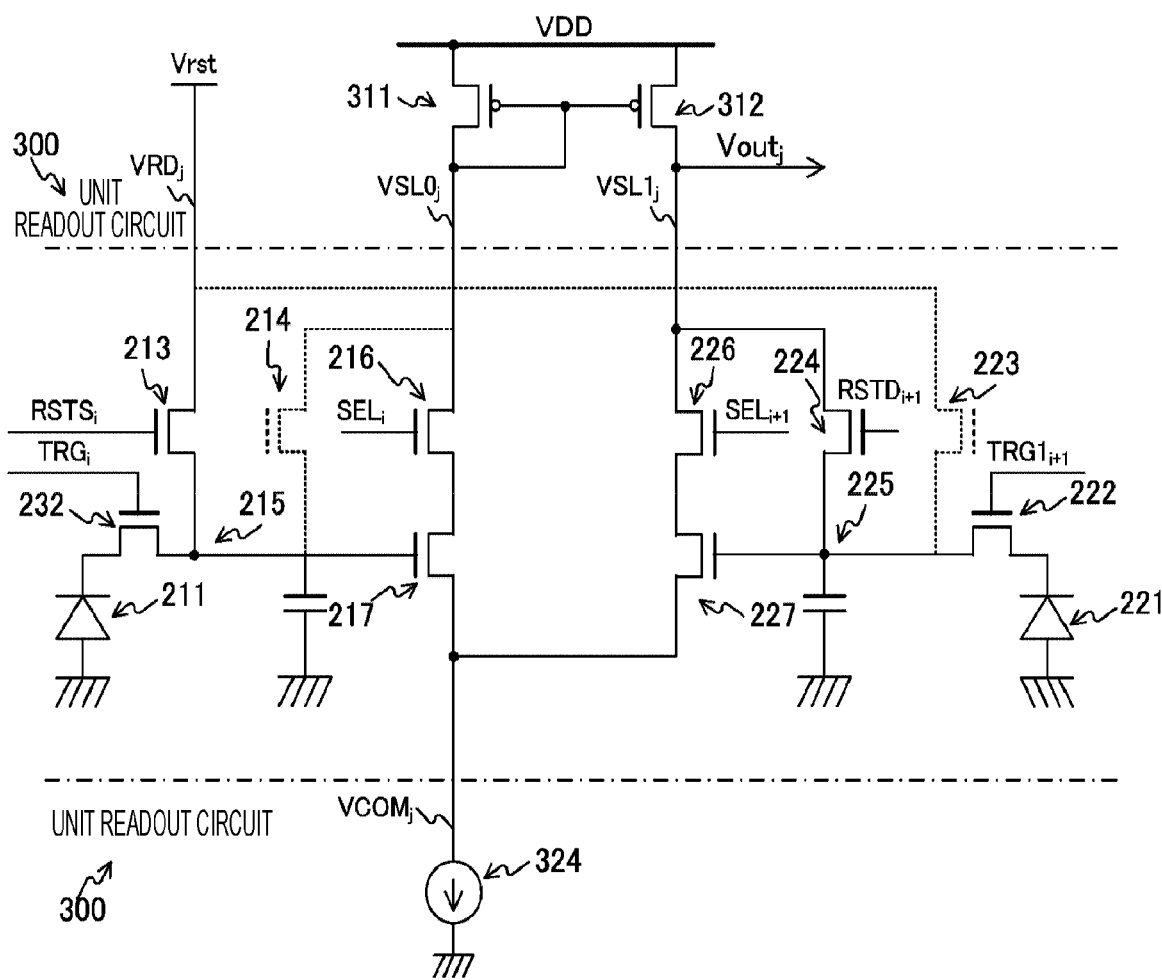
FIG. 7 is a circuit diagram of an exemplary configuration of a differential amplifier circuit including the unit readout circuit and the pixels according to the first embodiment of the present technology.

FIG. 7 is a circuit diagram of an exemplary configuration of a differential amplifier circuit including the unit readout circuit 300 and the pixels 210 and 220 according to the first embodiment of the present technology. The differential pixel readout circuit includes the signal pixel for readout, the reference pixel for giving the reference voltage, a current mirror circuit arranged in the column readout circuit unit 13, and the current source 324. Here, desirably, the potential of the floating diffusion region of the reference pixel at the time of resetting is equivalent in variation to the potential of the floating diffusion region of the signal pixel. Thus, favorably, the reference pixel is, for example, an inactive effective pixel in which readout has been finished, in proximity to a readout pixel. In the figure, the pixel 210 is used as the reference pixel, and the pixel 220 is used as the signal pixel. Note that, in the figure, for convenience of illustration, the switches 313 to 323 are omitted.

The vertical reset input line $VRD_j$ is in connection with the predetermined reset voltage Vrst at the unit readout circuit 300 in the column readout circuit unit 13. At the time of resetting, a desired input voltage signal is applied to the floating diffusion region 215 of the reference pixel selected through the wiring, namely, to the input terminal of the amplification transistor 217 on the reference side.

The vertical signal line $VSL0_j$ on the reference side is in connection with the drain and the gate of the P-type transistor 311 and the gate of the P-type transistor 312 in the current mirror circuit in the column readout circuit unit 13.

Meanwhile, the vertical signal line $VSL1_j$ on the readout side is connected with the drain of the P-type transistor 312 in the column readout circuit unit 13 and is connected to the floating diffusion region 225 of the signal pixel (namely, the input terminal of the amplification transistor 227 on the readout side) through the readout reset transistor 224. This arrangement causes negative feedback of an output signal of the differential-type amplifier circuit. The output signal of the differential-type amplifier circuit is extracted from the vertical signal line $VSL1_j$. Furthermore, the vertical current supply line $VCOM_j$ connected with both of the reference side and the readout side is connected with the current source 324.

In a case where the reference pixel (here, the pixel 210) generates the reference voltage, the reference reset transistor 213 is turned on, so that the reset voltage Vrst is supplied to the floating diffusion region 215. Meanwhile, for the signal pixel (here, the pixel 220), in a case where the signal voltage is read out, the readout reset transistor 224 is turned on just before transfer, so that the floating diffusion region 225 is supplied with voltage different from the reset voltage Vrst, corresponding to the power-source voltage VDD through the current mirror circuit. Then, in the signal pixel, electric charge is transferred from the photodiode 221, resulting in generation of the signal voltage. A signal resulting from amplification of the difference between the reference voltage and the signal voltage is read out as the pixel signal $Vout_j$.

The positional relationship between the reference pixel and the signal pixel is not fixed. As described above, the reference pixel and the signal pixel can be switched around. For example, the pixel 210 is selected as the reference pixel and the pixel 220 is selected as the signal pixel, and then the pixel 210 is selected as the signal pixel and the pixel 220 is selected as the reference pixel.

Figure 8:
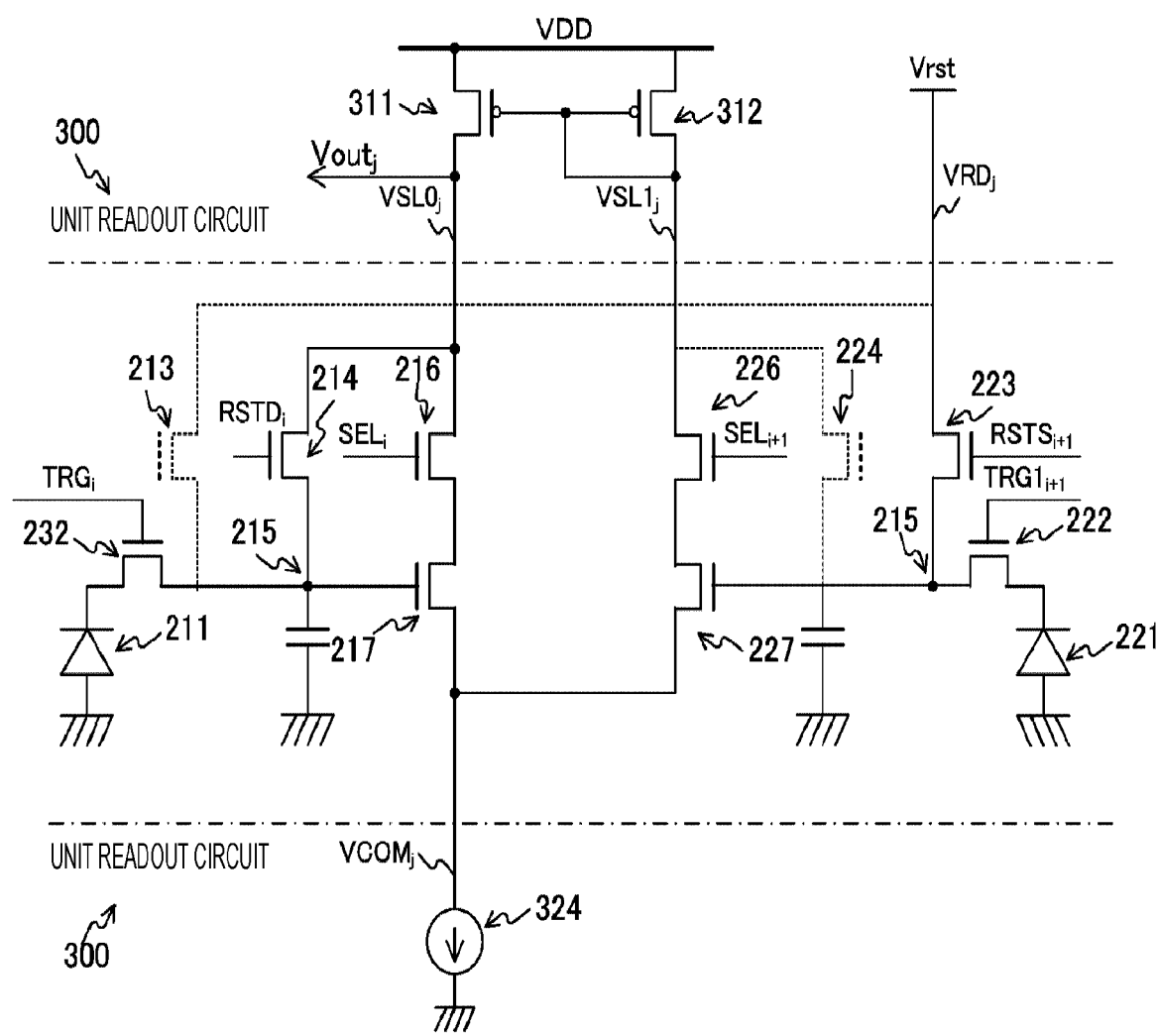
FIG. 8 is a circuit diagram of an exemplary configuration of the differential amplifier circuit with a reference pixel and a signal pixel switched around, according to the first embodiment of the present technology.

FIG. 8 is a circuit diagram of an exemplary configuration of the differential amplifier circuit with the reference pixel and the signal pixel switched around, according to the first embodiment of the present technology. Note that, in the figure, for convenience of illustration, the switches 313 to 323 are omitted.

Because the pixel 220 is the reference pixel, the reference reset transistor 223 is turned on, so that the floating diffusion region 225 is supplied with the reset voltage Vrst. Meanwhile, because the pixel 210 is the signal pixel, the readout reset transistor 214 is turned on just before transfer of electric charge, so that the floating diffusion region 215 is supplied with voltage different from the reset voltage Vrst.

Here, as a comparative example, it is assumed that only one reset transistor is arranged in every pixel.

Figure 9:
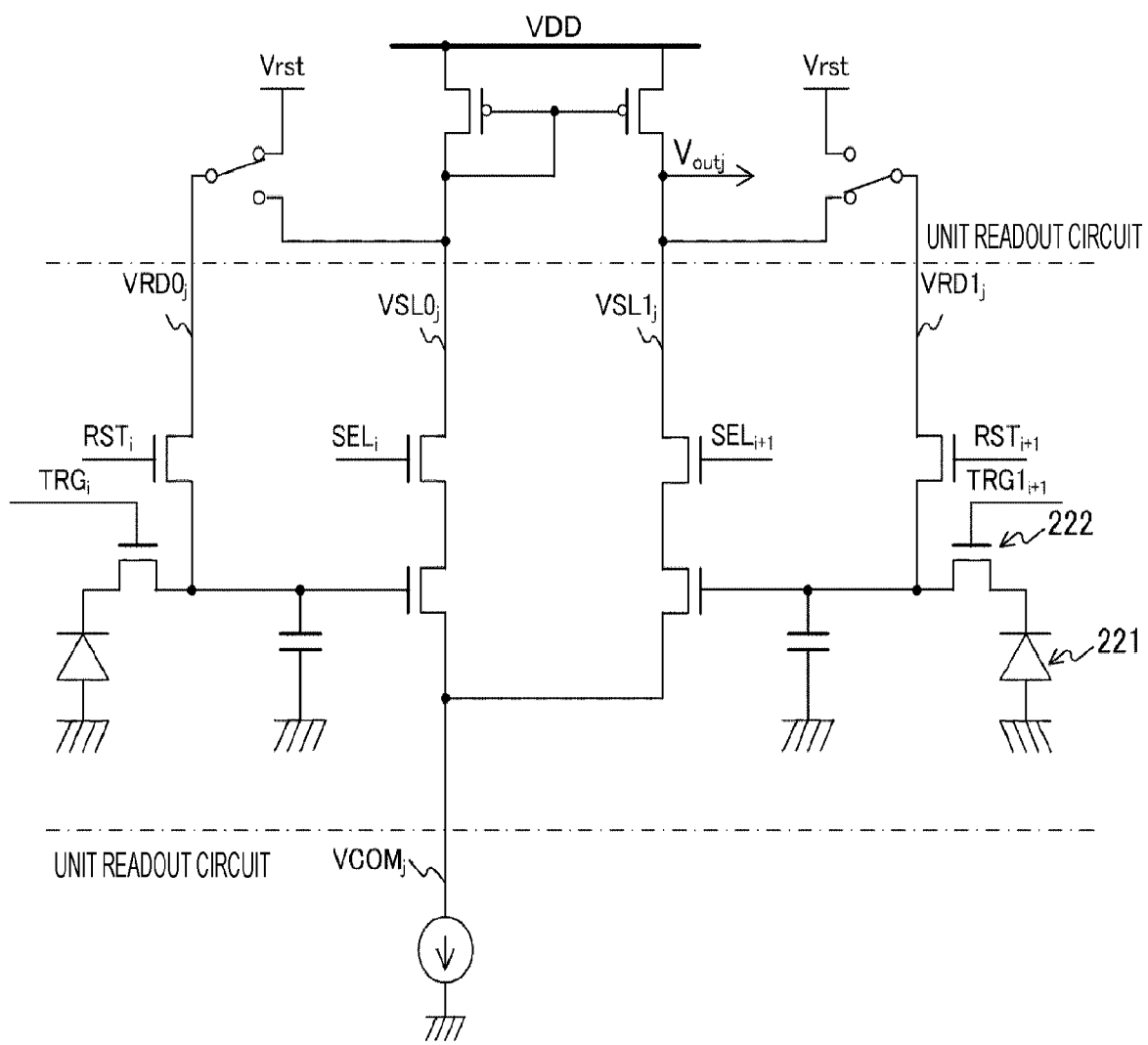
FIG. 9 is a circuit diagram of an exemplary configuration of a differential amplifier circuit according to a comparative example.

FIG. 9 is a circuit diagram of an exemplary configuration of a differential amplifier circuit according to the comparative example. According to the comparative example, the signal pixel and the reference pixel each include only one reset transistor. However, for achievement of switching the reference pixel and the signal pixel around as described above, in every pixel, the connecting destination of the floating diffusion region needs to be switched to either the reset voltage Vrst or the power-source voltage VDD. Thus, according to the comparative example, two vertical reset input lines are arranged as $VRD0_j$ and $VRD1_j$, and $VRD0_j$ and $VRD1_j$ are connected to the respective reset transistors of the pair of pixels. Furthermore, added are a switch that switches the connecting destination of the vertical reset input line $VRD0_j$ to either the vertical signal line $VSL0_j$ or the reset voltage Vrst, and a switch that switches the connecting destination of the vertical reset input line $VRD1_j$ to either the vertical signal line $VSL1_j$ or the reset voltage Vrst. The switches switch the connecting destinations of the vertical reset input lines $VRD0_j$ and $VRD1_j$, so that the reference pixel and the signal pixel can be switched around.

Note that, according to the comparative example, two vertical reset input lines need to be arranged in the vertical direction in every column. In contrast to this, as exemplified in FIGS. 7 and 8, in the pixels 210 and 220, two reset transistors are arranged instead of the switches in FIG. 9. The two reset transistors switch the connecting destination of the floating diffusion region. Thus, only one vertical reset input line is required in every column, so that the number of wiring lines in the vertical direction can be reduced by one in every column, in comparison to the comparative example.

Figure 10:
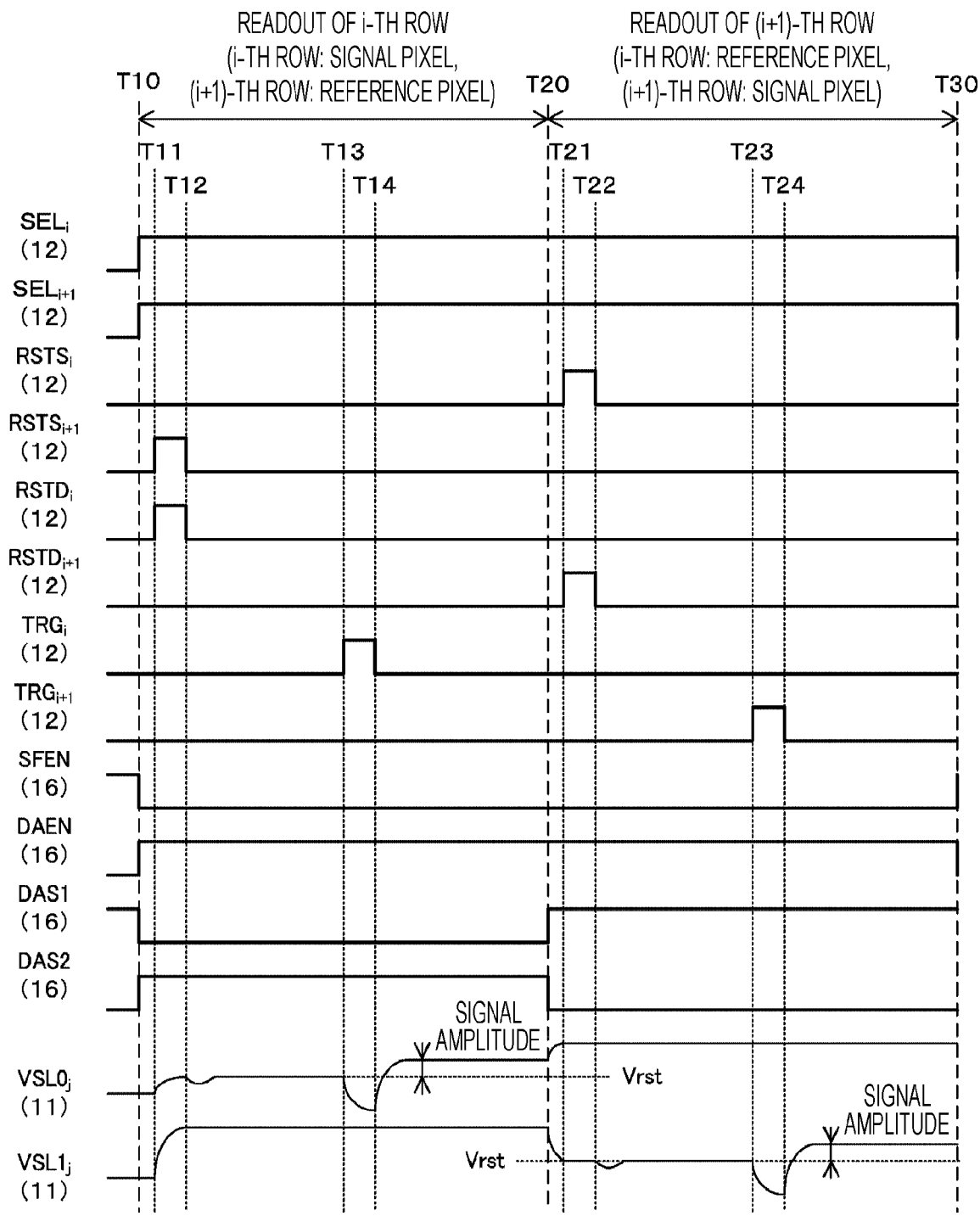
FIG. 10 is a timing chart of an exemplary operation of the CMOS image sensor in differential mode according to the first embodiment of the present technology.

FIG. 10 is a timing chart of an exemplary operation of the CMOS image sensor 10 in the differential mode according to the first embodiment of the present technology.

The vertical drive unit 12 simultaneously selects the i-th row and the i+1-th row adjacent to each other, and repeats processing of reading out the pixel signals in sequence from the rows. In a case where the number of rows is I, processing of simultaneously selecting two rows is performed I/2 times, and readout of one row is performed I times. This arrangement causes readout of all rows. For example, the i-th row and the i+1-th row are simultaneously selected during the period of from time T10 to time T30. Then, the i-th row is read out in the period of from time T10 to time T20, and each pixel in the i+1-th row is used as the reference pixel. The i+1-th row is read out in the period of from time T20 to time T30, and each pixel in the i-th row is used as the reference pixel.

In the example, drive signals $SEL_i$ and $SEL_{i+1}$ are high in level during the period of from time T10 to time T30. Furthermore, in the differential mode, the drive signal SFEN is kept low in level and the drive signal DAEN is kept high in level. From time T10 to time T20, for the i-th row having the signal pixel, the drive signal DAS1 is low in level and the drive signal DAS2 is high in level.

Because drive signals $RSTS_{i+1}$ and $RSTD_i$ are high in level during the period of from time T11 to time T12, negative feedback circuits are formed, and the floating diffusion region in each differential pair is reset. Then, in the period of from time T12 to time T13, the level of the vertical signal line $VSL0_j$ is subjected as a reset level to AD conversion.

Next, the vertical drive unit 12 makes the drive signal $TRG_i$ high in level during the period of from time T13 to time T14. This arrangement causes transfer of accumulated electric charge from the photodiode to the floating diffusion region. Then, in the period of from time T14 to time T20, the level of the vertical signal line $VSL0_j$ is subjected as a signal level to AD conversion. For example, the column signal processing unit 14 performs CDS processing for acquisition of the difference between the reset level and the signal level to acquire signal amplitude.

During the period of from time T20 to time T30, for the i+1-th row having the readout pixel and the i-th row having the reference pixel. The drive signal DAS1 is high in level and the drive signal DAS2 is low in level.

Because drive signals $RSTS_i$ and $RSTD_{i+1}$ are high in level during the period of from time T21 to time T22, negative feedback circuits are formed, and the floating diffusion region in each differential pair is reset. Then, in the period of from time T22 to time T23, the level of the vertical signal line VSL1$_j$ is subjected as a reset level to AD conversion.

Next, the vertical drive unit 12 makes a drive signal TRG$_{i+1}$ high in level during the period of from time T23 to time T24. This arrangement causes transfer of accumulated electric charge from the photodiode to the floating diffusion region. Then, in the period of from time T24 to time T30, the level of the vertical signal line VSL1$_j$ is subjected as a signal level to AD conversion. For example, the column signal processing unit 14 performs CDS processing for acquisition of the difference between the reset level and the signal level to acquire signal amplitude.

Figure 11:
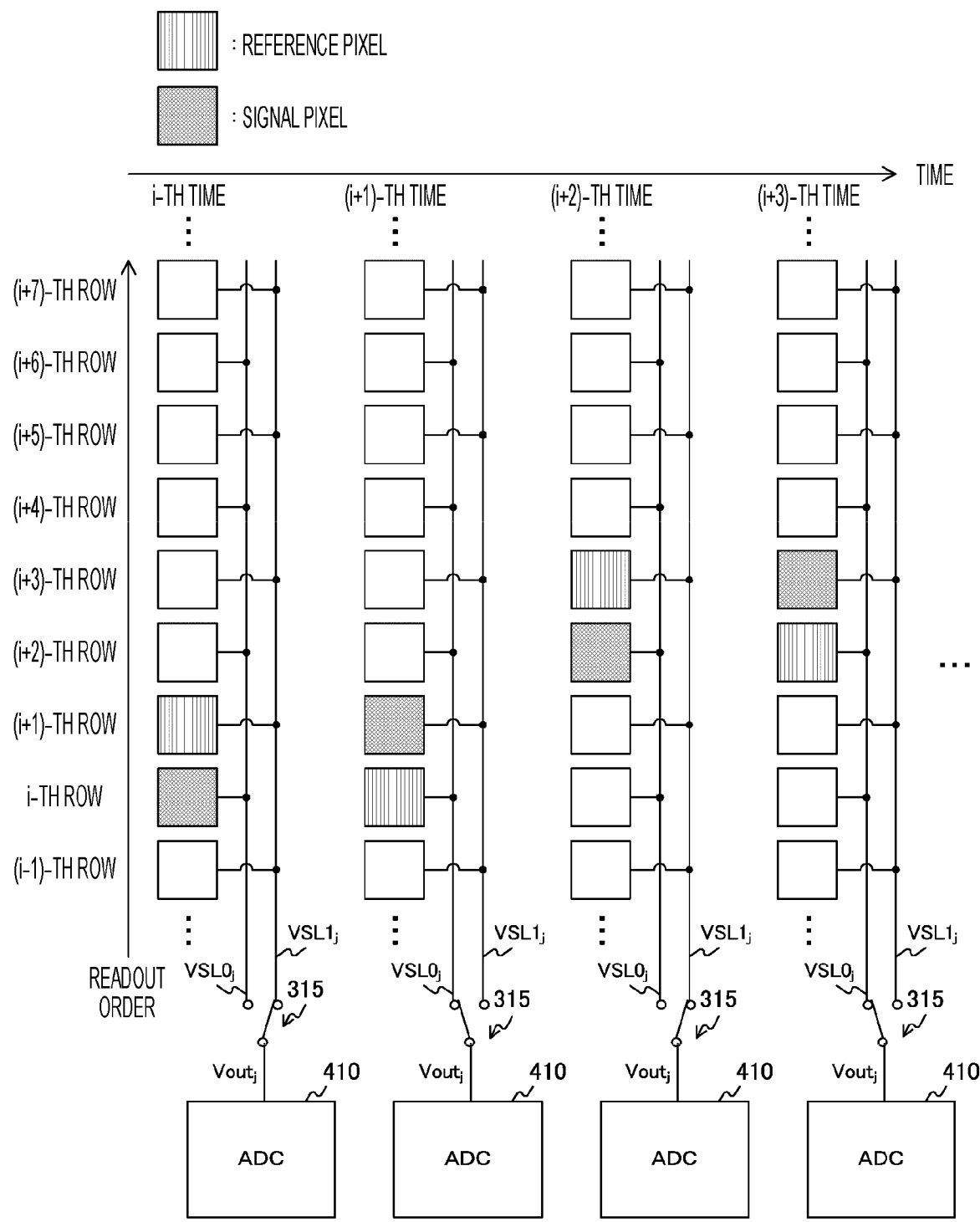
FIG. 11 illustrates an exemplary positional relationship between the signal pixel and the reference signal in the differential mode according to the first embodiment of the present technology.

FIG. 11 illustrates exemplary positional relationships between the signal pixel and the reference pixel in the differential mode according to the first embodiment of the present technology. In the figure, the rows except the j-th row are omitted. Furthermore, in the figure, each pixel subjected to hatching with crosslines is the signal pixel, and each pixel subjected to hatching with vertical lines is the reference pixel. Each pixel in white is a non-selected pixel belonging to neither the reference pixel nor the signal pixel.

The vertical drive unit 12 simultaneously selects the i-th row and the i+1-th row, and reads out the i-th row with differential amplifier circuits each having a pixel in the i-th row as the signal pixel and a pixel in the i+1-th row as the reference pixel. Next, the vertical drive unit 12 reads out the i+1-th row with differential amplifier circuits each having a pixel in the i+1-th row as the signal pixel and a pixel in the i-th row as the reference pixel.

Then, the vertical drive unit 12 simultaneously selects the i+2-th row and the i+3-th row, and reads out the i+2-th row with differential amplifier circuits each having a pixel in the i+2-th row as the signal pixel and a pixel in the i+3-th row as the reference pixel. Next, the vertical drive unit 12 reads out the i+3-th row with differential amplifier circuits each having a pixel in the i+3-th row as the reference pixel and a pixel in the i+2-th row as the reference pixel. After that, similarly, a pair of rows adjacent to each other is selected, and the rows are read out one by one.

Note that in the vertical drive unit 12, a pixel adjacent to the signal pixel is the reference pixel, in the vertical direction, but the configuration is not limitative. For example, in the vertical drive unit 12, a pixel not adjacent to the signal pixel may be the reference pixel. In this case, for example, in a case where each pixel in the i+3-th row is the signal pixel, each pixel in the i-th row may be the reference pixel. Thus, independent pixels are interposed between the signal pixel and the reference pixel.

Figure 12:
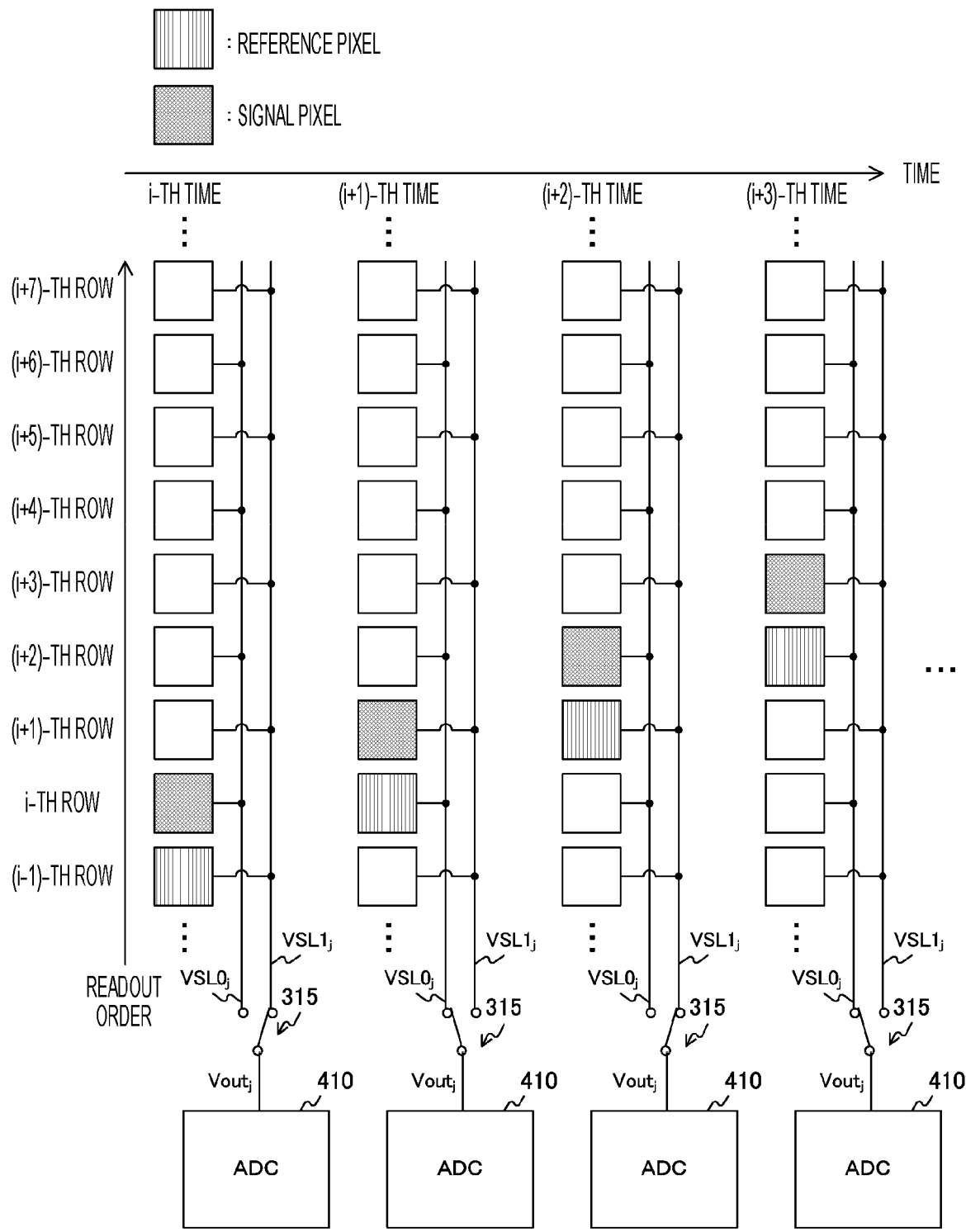
FIG. 12 illustrates another exemplary positional relationship between the signal pixel and the reference signal in the differential mode according to the first embodiment of the present technology.

Furthermore, as exemplified in FIG. 12, a pixel at a predetermined relative position to the signal pixel can be the reference pixel. In the figure, in a case where each pixel in the i-th row is the signal pixel, the vertical drive unit 12 reads out the i-th row with differential amplifier circuits, with the i−1-th row having the reference pixel.

Figure 13:
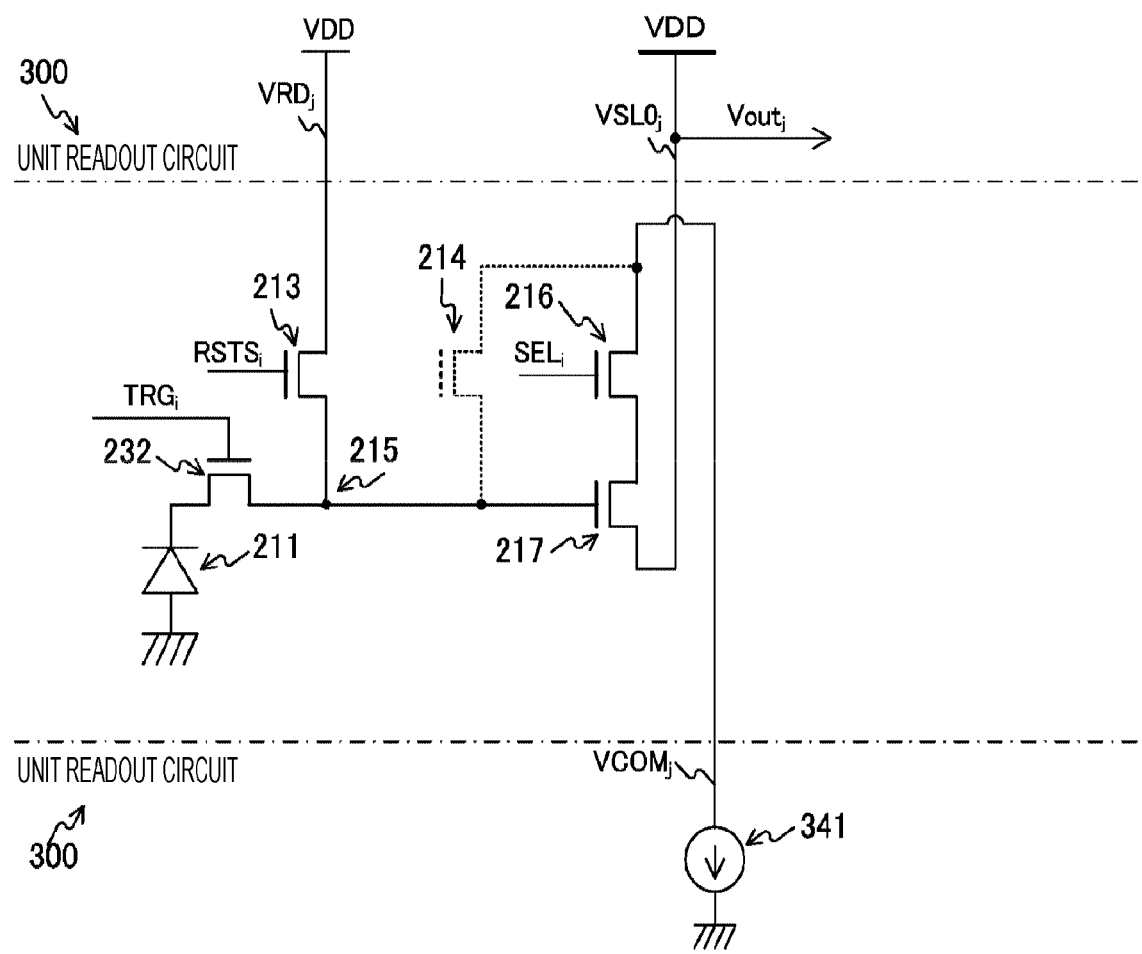
FIG. 13 is a circuit diagram of an exemplary configuration of a source follower circuit including the unit readout circuit and a pixel according to the first embodiment of the present technology.

FIG. 13 is a circuit diagram of an exemplary configuration of a source follower circuit including the unit readout circuit 300 and the pixel 210 according to the first embodiment of the present technology. Note that, in the figure, for convenience of illustration, the switches 313 to 323 are omitted.

The vertical reset input line VRD$_j$ is connected to the floating diffusion region 215 through the reference reset transistor 213. Furthermore, the selection transistor 216 and the amplification transistor 217 are interposed in series between the vertical signal line VSL0$_j$ and the vertical current supply line VCOM$_j$.

Figure 14:
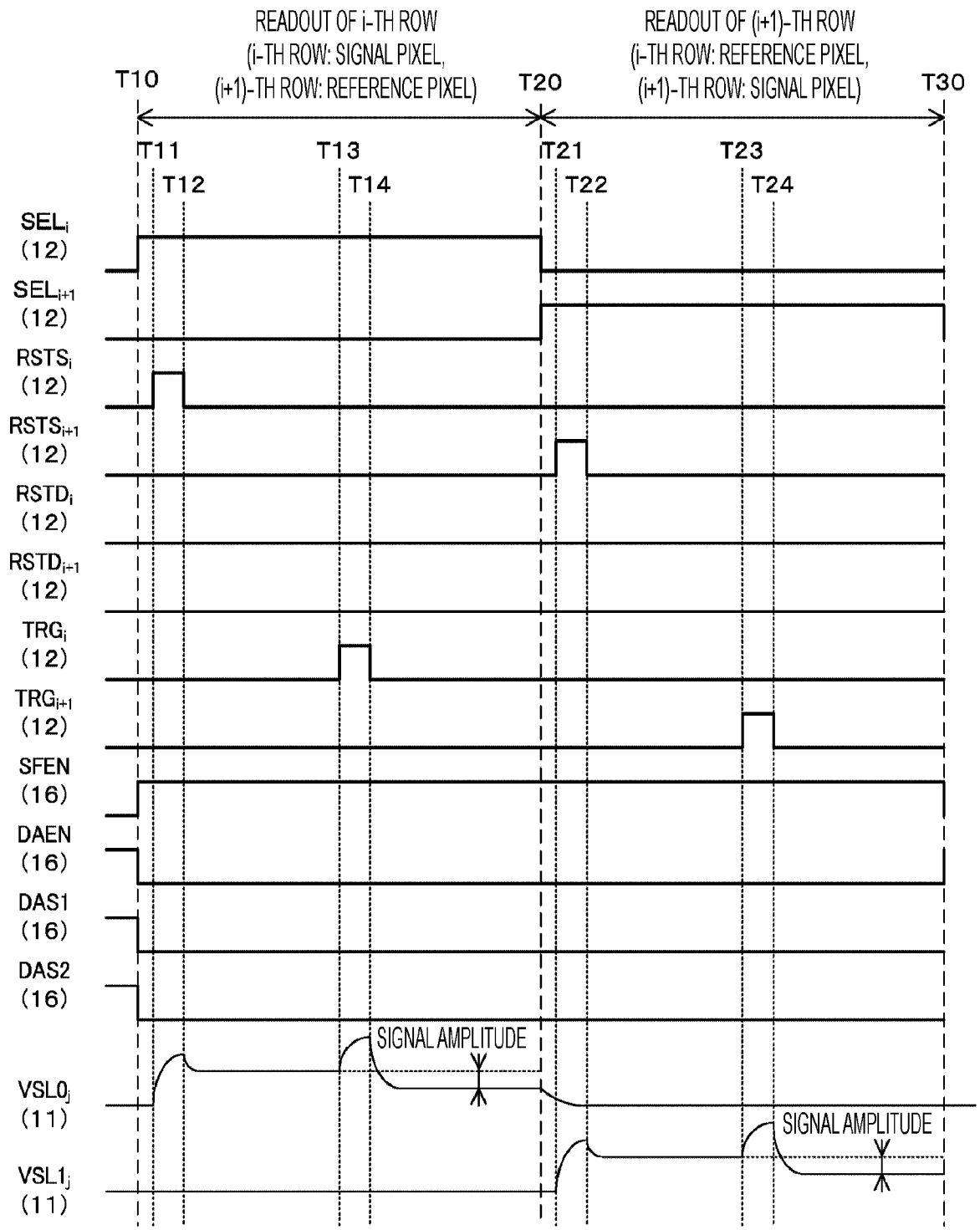
FIG. 14 is a timing chart of an exemplary operation of the CMOS image sensor in source follower mode according to the first embodiment of the present technology.

FIG. 14 is a timing chart of an exemplary operation of the CMOS image sensor 10 in the SF mode according to the first embodiment of the present technology.

In the SF mode, the drive signal SFEN is kept high in level and the drive signal DAEN is kept low in level. From time T10 to time T20, for readout of the i-th row, the drive signal SEL$_i$ is high in level. During the period of from time T11 to time T12, the drive signal RSTS$_i$ is high in level, and each floating diffusion region is reset. Next, in the period of from time T12 to time T13, the level of the vertical signal line VSL0$_j$ is subjected as a reset level to AD conversion.

The vertical drive unit 12 makes the drive signal TRG$_i$ high in level during the period of from time T13 to time T14. This arrangement causes transfer of accumulated electric charge from the photodiode to the floating diffusion region. Next, in the period of from time T14 to time T20, the level of the vertical signal line VSL0$_j$ is subjected as a signal level to AD conversion. For example, the column signal processing unit 14 performs CDS processing for acquisition of the difference between the reset level and the signal level to acquire signal amplitude.

From time T20 to time T30, for readout of the i+1-th row, the drive unit SEL$_{i+1}$ is high in level. During the period of from time T21 to time T22, the drive signal RSTS$_{i+1}$ is high in level, and each floating diffusion region is reset. Next, in the period of from time T22 to time T23, the level of the vertical signal line VSL1$_j$ is subjected as a reset level to AD conversion.

The vertical drive unit 12 makes the drive signal TRG$_{i+1}$ high in level during the period of from time T23 to time T24. This arrangement causes transfer of accumulated electric charge from the photodiode to the floating diffusion region. Next, in the period of from time T24 to time T30, the level of the vertical signal line VSL1$_j$ is subjected as a signal level to AD conversion. For example, the column signal processing unit 14 performs CDS processing for acquisition of the difference between the reset level and the signal level to acquire signal amplitude.

Figure 15:
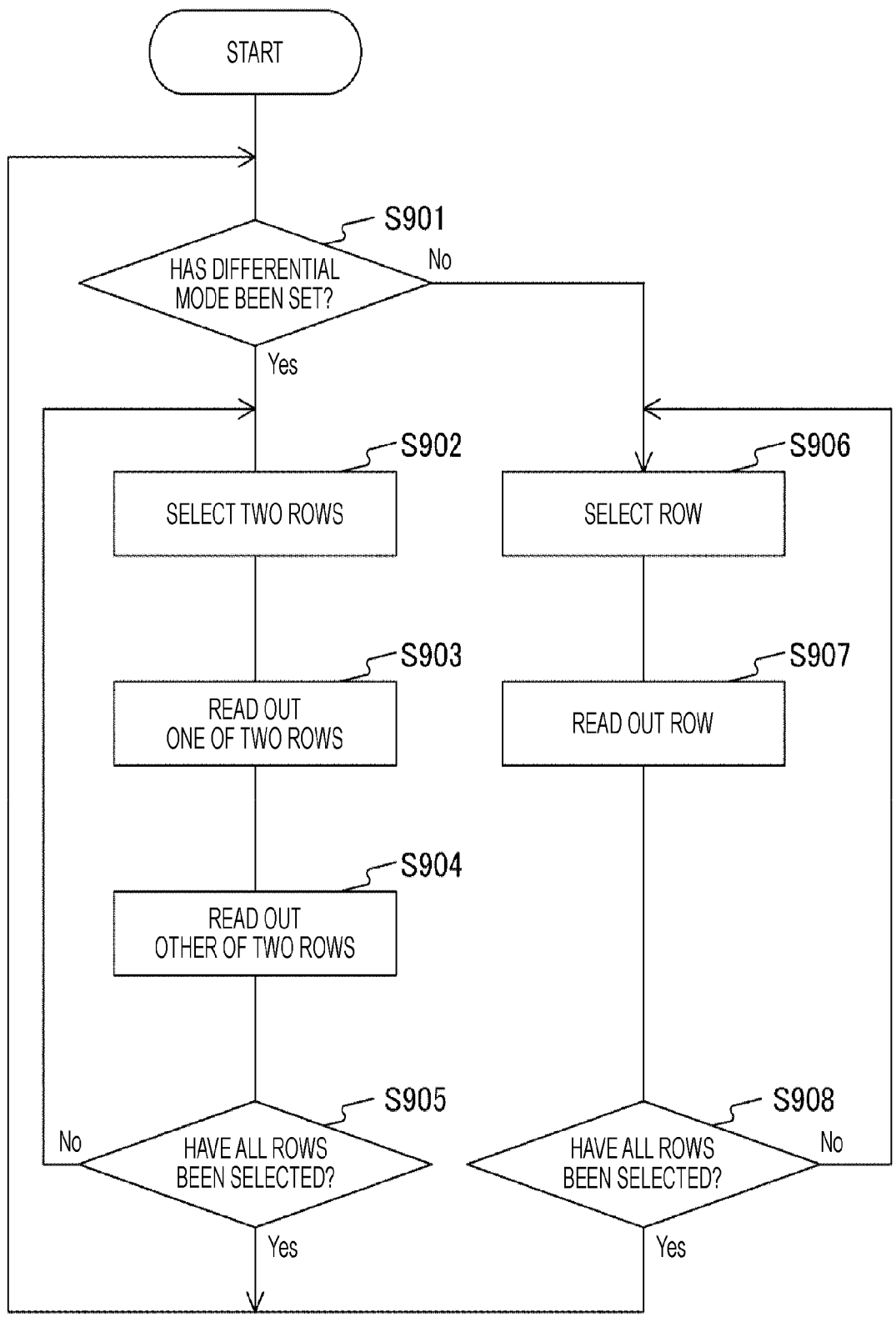
FIG. 15 is a flowchart of an exemplary operation of the CMOS image sensor according to the first embodiment of the present technology.

FIG. 15 is a flowchart of an exemplary operation of the CMOS image sensor 10 according to the first embodiment of the present technology. For example, the operation starts when a predetermined application for capturing image data is executed.

The CMOS image sensor 10 determines whether or not the differential mode has been set (step S901). In a case where the differential mode has been set (step S901: Yes), the CMOS image sensor 10 selects two not yet selected rows (step S902). Then, the CMOS image sensor 10 performs, in sequence, readout of one of the two rows (step S903) and readout of the other (step S904).

Then, the CMOS image sensor 10 determines whether or not all rows have been selected (step S905). In a case where any of the rows have not been selected (step S905: No), the CMOS image sensor 10 repeats the processing from step S902. Meanwhile, in a case where all rows have been selected (step S905: Yes), the CMOS image sensor 10 repeats the processing from step S901.

In a case where the SF mode has been set (step S901: No), the CMOS image sensor 10 selects any of not yet selected rows (step S906), and performs readout of the row (step S907).

Then, the CMOS image sensor 10 determines whether or not all rows have been selected (step S908). In a case where any of the rows have not been selected (step S908: No), the CMOS image sensor 10 repeats the processing from step S906. Meanwhile, in a case where all rows have been selected (step S908: Yes), the CMOS image sensor 10 repeats the processing from step S901.

As described above, according to the first embodiment of the present technology, the reference reset transistor 213 and the readout reset transistor 214 switch the connecting destination of the floating diffusion region 215. Therefore, the vertical reset input line $VRD_j$ can be connected to both of the respective reference reset transistors 213 and 223 of two pixels. This arrangement enables a reduction in the number of vertical reset input lines, in comparison to a case where different vertical reset input lines are connected to the respective reference reset transistors of two pixels.

2. Second Embodiment

According to the first embodiment, pixel signals are generated by arranging one reference reset transistor and one readout reset transistor in every pixel. However, according to the configuration, it is difficult to control the total capacity of the floating diffusion region 215. A CMOS image sensor 10 according to a second embodiment is different from that according to the first embodiment in that the total capacity of a floating diffusion region 215 is controlled by connecting a plurality of reset transistors in series.

Figure 16:
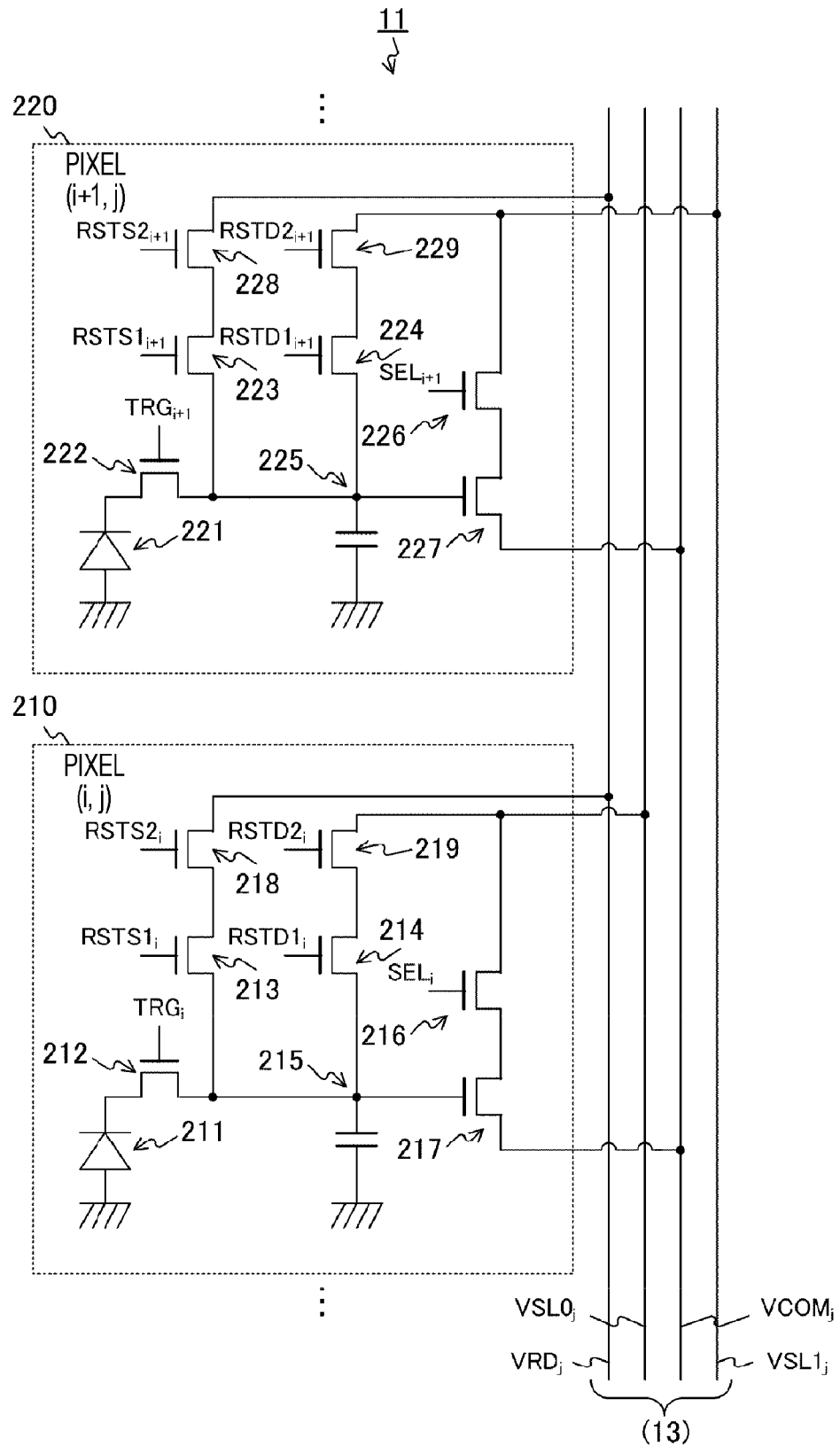
FIG. 16 is a circuit diagram of an exemplary configuration of pixels according to a second embodiment of the present technology.

FIG. 16 is a circuit diagram of an exemplary configuration of pixels 210 and 220 according to the second embodiment of the present technology. The pixel 210 according to the second embodiment is different from that according to the first embodiment in that a reference reset transistor 218 and a readout reset transistor 219 are further provided.

Reference reset transistors 213 and 218 are connected in series between the floating diffusion region 215 and a vertical reset input line $VRD_j$. Furthermore, the readout reset transistors 214 and 219 are connected in series between the floating diffusion region 215 and a vertical signal line $VSL0_j$.

A vertical drive unit 12 supplies a drive signal $RSTS1_i$ to the reference reset transistor 213 and supplies a drive signal $RSTS2_i$ to the reference reset transistor 218. Furthermore, the vertical drive unit 12 supplies a drive signal $RSTD1_i$ to the readout reset transistor 214 and supplies a drive signal $RSTD2_i$ to the readout reset transistor 219.

For example, the vertical drive unit 12 keeps the drive signals $RSTS1_i$ and $RSTD1_i$ high in level, and supplies, at the time of initialization, a pulse as the drive signal $RSTS2_i$ or $RSTD2_i$. This control enables an increase in the total capacity of the floating diffusion region 215, in comparison to the first embodiment. The increase in the total capacity enables readout of a signal having an increase in the maximum number of accumulable electrons, with decrease in conversion efficiency.

Note that the vertical drive unit 12 can keep the drive signals $RSTS2_i$ and $RSTD2_i$ high in level, and can supply, at the time of initialization, a pulse as the drive signal $RSTS1_i$ or $RSTD1_i$. This control enables a decrease in the total capacity of the floating diffusion region 215, in comparison to the first embodiment. The decrease in the total capacity enables readout of a signal low in noise, with improvement in conversion efficiency.

Similarly in the pixel 220, a reference reset transistor 228 and a readout reset transistor 229 are arranged.

As described above, according to the second embodiment of the present technology, the reference reset transistors 213 and 218 are connected in series, and the readout reset transistors 214 and 219 are connected in series. Thus, the total capacity of the floating diffusion region 215 can be controlled with two transistors kept on among the transistors.

[Modification]

According to the second embodiment, two reference reset transistors and two readout reset transistors are arranged in every pixel. However, the number of transistors per pixel in the configuration is larger than that according to the first embodiment. Thus, an increase is likely to occur in circuit scale. A CMOS image sensor 10 according to a modification of the second embodiment is different from that according to the second embodiment in that the number of reset transistors is reduced.

Figure 17:
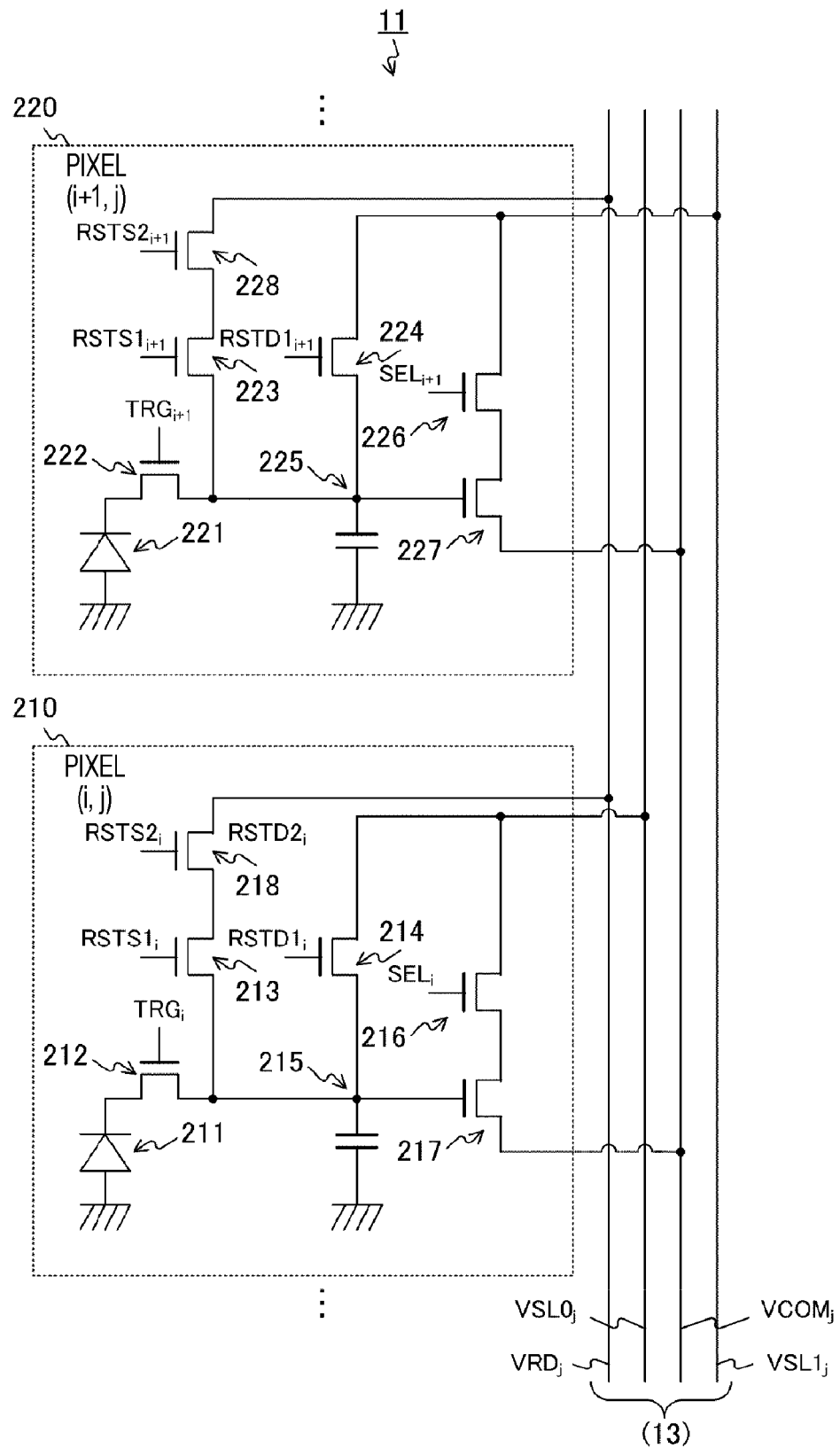
FIG. 17 is a circuit diagram of an exemplary configuration of pixels according to a modification of the second embodiment of the present technology.

FIG. 17 is a circuit diagram of an exemplary configuration of pixels 210 and 220 according to the modification of the second embodiment of the present technology. The pixels 210 and 220 according to the modification of the second embodiment are different from those according to the second embodiment in that readout reset transistors 219 and 229 are reduced.

Figure 18:
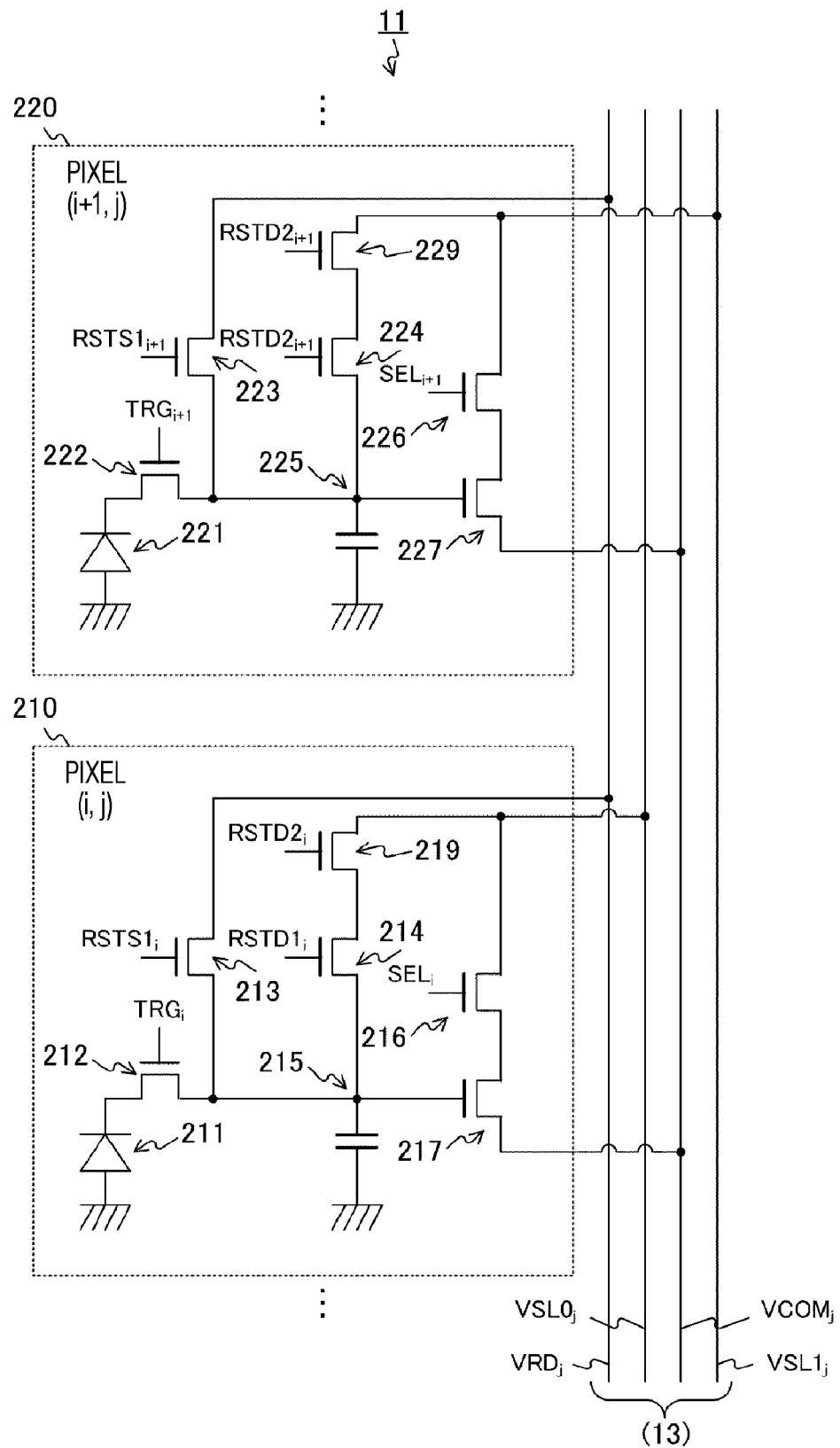
FIG. 18 is a circuit diagram of an exemplary configuration of the pixels in which the number of transistors is changed according to the modification of the second embodiment of the present technology.

Note that, as exemplified in FIG. 18, reference reset transistors 218 and 228 can be reduced.

As described above, according to the modification of the second embodiment of the present technology, the number of reset transistors is reduced by one in every pixel. Thus, the CMOS image sensor 10 can be reduced in circuit scale.

3. Third Embodiment

According to the first embodiment, pixel signals are generated by arranging one reference reset transistor and one readout reset transistor in every pixel. However, according to the configuration, it is difficult to control the total capacity of the floating diffusion region 215. A CMOS image sensor 10 according to a third embodiment is different from that according to the first embodiment in that the total capacity of a floating diffusion region 215 is controlled by connecting a plurality of reset transistors in series.

Figure 19:
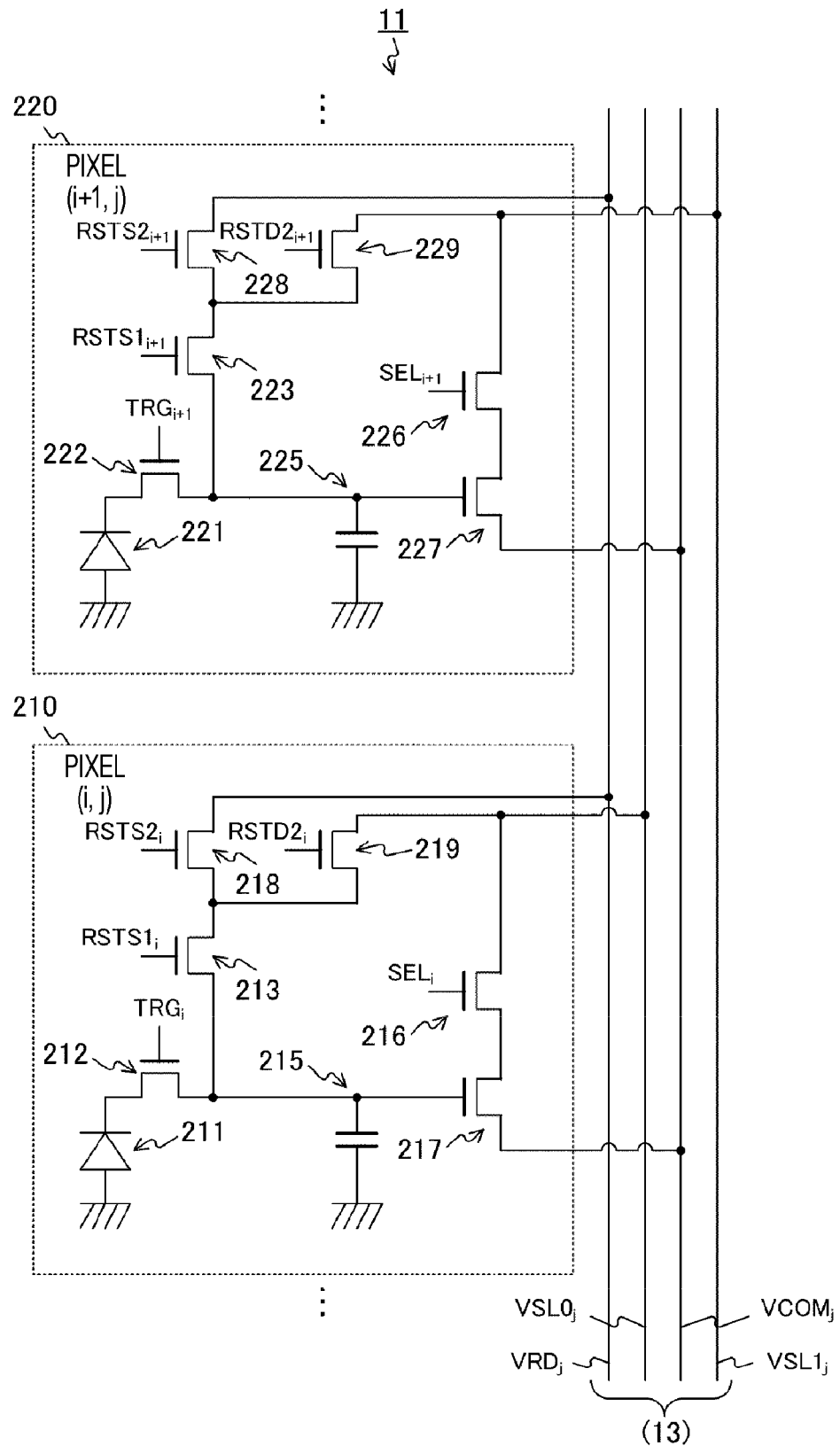
FIG. 19 is a circuit diagram of an exemplary configuration of pixels according to a modification of a third embodiment of the present technology.

FIG. 19 is a circuit diagram of an exemplary configuration of pixels 210 and 220 according to the third embodiment of the present technology. The pixel 210 according to the third embodiment is different from that according to the first embodiment in that a reference reset transistor 218 and a readout reset transistor 219 are provided instead of a readout reset transistor 214. The reference reset transistor 218 is connected in series with a reference reset transistor 213, and the readout reset transistor 219 is connected in parallel to the reference reset transistor 218 at the connection point between the reference reset transistors 213 and 218. Similarly in the pixel 220, a reference reset transistor 228 and a readout reset transistor 229 are provided instead of a readout reset transistor 224. Then, the reference reset transistor 228 is connected in series with a reference reset transistor 223, and the readout reset transistor 229 is connected in parallel to the reference reset transistor 228 at the connection point between the reference reset transistors 223 and 228.

A vertical drive unit 12 keeps a drive signal $RSTS1_i$ high in level, and supplies, at the time of initialization, a pulse as a drive signal $RSTS2_i$ or $RSTD2_i$. This control enables an increase in the total capacity of the floating diffusion region 215, in comparison to the first embodiment. The increase in the total capacity enables readout of a signal having an increase in the maximum number of accumulable electrons, with decrease in conversion efficiency.

As described above, according to the third embodiment of the present technology, the total capacity of the floating diffusion region 215 can be controlled by connecting the reference reset transistor 213 and the reference reset transistor 218 in series.

4. Modification (Multilayered-Type Configurations)

Figure 20:
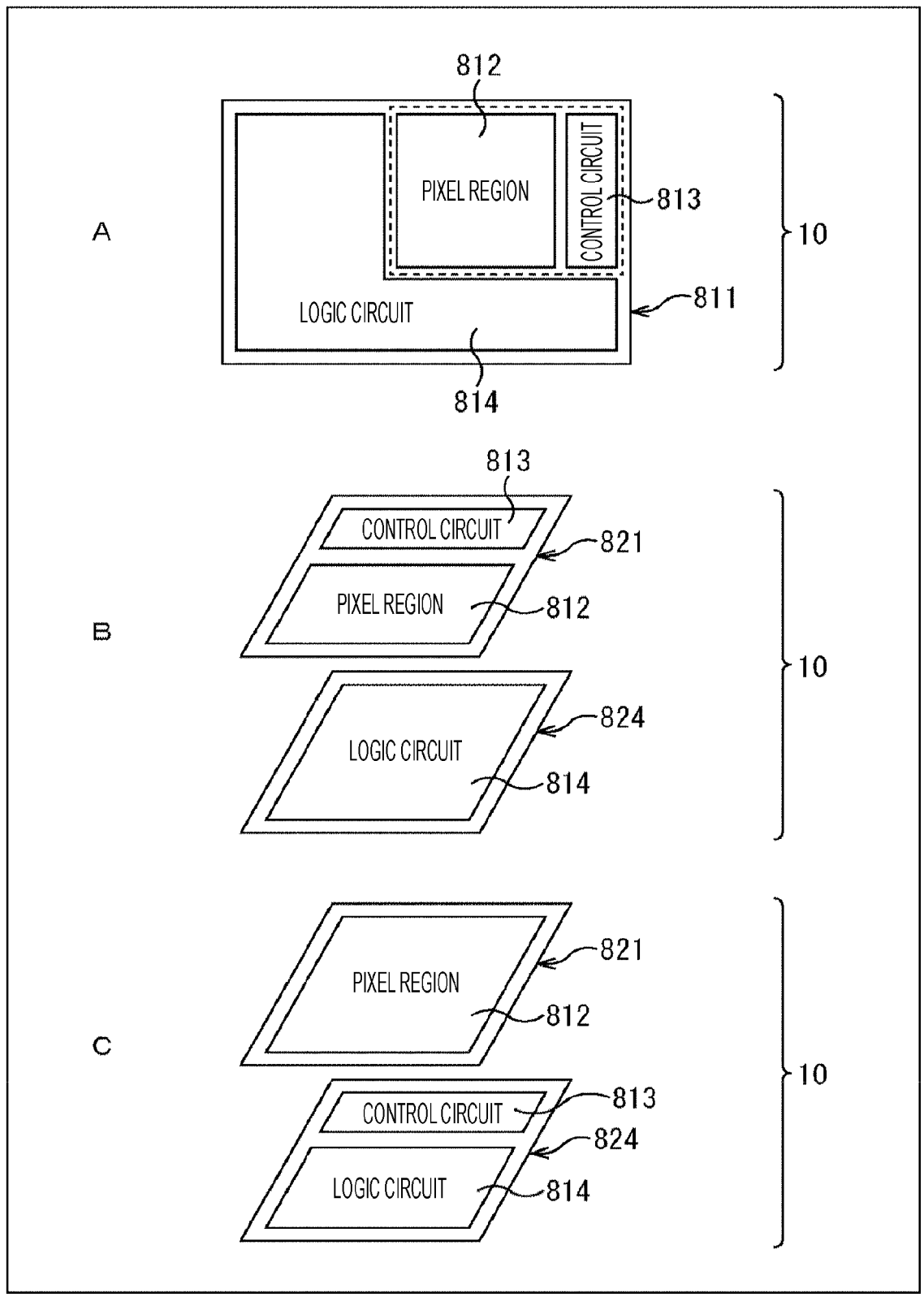
FIG. 20 illustrates exemplary configurations of multilayered-type solid-state image pickup devices to which the present technology can be applied.

FIG. 20 illustrates exemplary configurations of multilayered-type solid-state image pickup devices to which the present technology can be applied.

A of the figure schematically illustrates an exemplary configuration of a non-multilayered-type solid-state image pickup device. As illustrated in A of the figure, a CMOS image sensor 10 includes one die (semiconductor substrate) 811. The die 811 is equipped with a pixel region 812 in which pixels are two-dimensionally arranged, a control circuit 813 that performs various types of control including drive of the pixels and the like, and a logic circuit 814 for signal processing.

B and C of the figure schematically illustrate exemplary configurations of multilayered-type solid-state image pickup devices. The CMOS image sensors 10, as illustrated in B and C of the figure, each include one semiconductor chip in which two dice of a sensor die 821 and a logic die 824 are layered in electrical connection.

In B of the figure, the sensor die 821 is equipped with a pixel region 812 and a control circuit 813, and the logic die 824 is equipped with a logic circuit 814 including a signal processing circuit that performs signal processing.

In C of the figure, the sensor die 821 is equipped with a pixel region 812, and the logic die 824 is equipped with a control circuit 813 and a logic circuit 814.

(Configuration of Signal Processing Device)

In the above description, exemplary solid-state image pickup devices, such as the CMOS image sensors 10, have been given. However, the present technology is not limited to a solid-state image pickup device, and thus can be applied to a signal processing device that performs various types of signal processing. Note that, in the readout pixel (e.g., pixel 210) and the reference pixel (e.g., pixel 220), the floating diffusion region 215 and the floating diffusion region 225 as floating diffusion can be regarded as sample and hold circuits. That is, the amplification transistor 217 on the readout side is provided in accordance with respective input signals from a plurality of input channels, and amplifies the input signal input through the sample and hold circuit. The amplification transistor 227 on the reference side is paired with each amplification transistor 217 on the readout side.

5. Configuration of Electronic Apparatus

Figure 21:
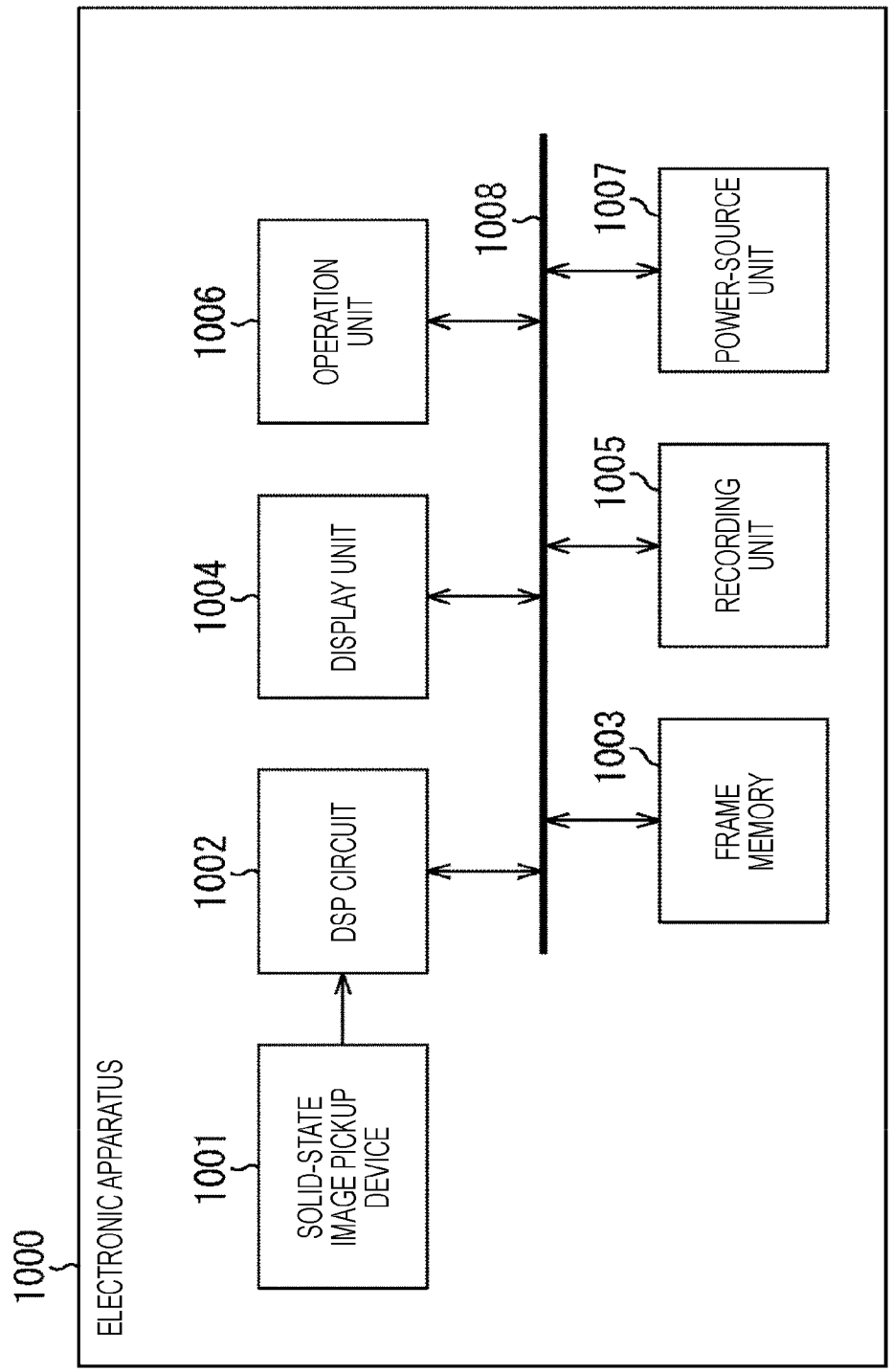
FIG. 21 is a block diagram of an exemplary configuration of an electronic apparatus including a solid-state image pickup device to which the present technology is applied.

FIG. 21 is a block diagram of an exemplary configuration of an electronic apparatus including a solid-state image pickup device to which the present technology is applied. Examples of the electronic apparatus 1000 include image pickup devices, such as a digital still camera and a video camera, mobile terminal devices, such as a smartphone and a tablet-type terminal, and the like.

The electronic apparatus 1000 includes a solid-state image pickup device 1001, a DSP circuit 1002, a frame memory 1003, a display unit 1004, a recording unit 1005, an operation unit 1006, and a power-source unit 1007. Furthermore, in the electronic apparatus 1000, the DSP circuit 1002, the frame memory 1003, the display unit 1004, the recording unit 1005, the operation unit 1006, and the power-source unit 1007 are in mutual connection through a bus line 1008.

The solid-state image pickup device 1001 corresponds to any of the CMOS image sensors 10 described above, and performs differential-type amplification readout or source-follower-type readout to the plurality of pixels two-dimensionally arranged in the pixel array unit 11.

Here, at the time of differential-type amplification readout, the reset voltage to the reference pixel can be externally applied and the reset voltage to the readout pixel can be negatively fed back from a vertical signal line 22S. Furthermore, at the time of differential-type amplification readout, either the node on the source side or the node on the drain side of the amplification transistor in the reference pixel or both the node on the source side and the node on the drain side can be connected (coupled) between each column in the pixel array unit.

The DSP circuit 1002 is a camera signal processing circuit that processes a signal supplied from the solid-state image pickup device 1001. The DSP circuit 1002 outputs image data acquired by processing to the signal from the solid-state image pickup device 1001. The frame memory 1003 temporarily retains the image data processed by the DSP circuit 1002 in units of frames.

For example, the display unit 1004 is a panel-type display device, such as a liquid crystal panel or an organic electro luminescence (EL) panel, and displays a moving image or a still image captured by the solid-state image pickup device 1001. The recording unit 1005 records image data of the moving image or the still image captured by the solid-state image pickup device 1001, onto a recording medium, such as a semiconductor memory or a hard disk.

In accordance with an operation of a user, the operation unit 1006 outputs an operation command for various types of functions that the electronic apparatus 1000 has.

The power-source unit 1007 appropriately supplies various types of power sources as the respective operation sources of the DSP circuit 1002, the frame memory 1003, the display unit 1004, the recording unit 1005, and the operation unit 1006, to the targets to be supplied with.

The electronic apparatus 1000 has the above configuration. As described above, the present technology is applied to the solid-state image pickup device 1001. Specifically, the CMOS image sensors 10 can be applied to the solid-state image pickup device 1001.

In the solid-state image pickup device 1001 to which the present technology is applied, at the time of differential-type amplification readout, the reset voltage to the reference pixel can be externally applied and the reset voltage to the readout pixel can be negatively fed back from the vertical signal line 22S. Therefore, the differential-type amplification readout enables, with achievement of a high conversion efficiency (amplification factor), not only inhibition of a deviation from a readout allowable range in reset level due to reset feedthrough but also control of the potential of the floating diffusion region in the readout pixel at the time of resetting, to a desired value.

Furthermore, in the solid-state image pickup device 1001 to which the present technology is applied, at the time of differential-type amplification readout, either the node on the source side or the node on the drain side of the amplification transistor in the reference pixel or both the node on the source side and the node on the drain side can be connected (coupled) between each column in the pixel array unit. Therefore, the differential-type amplification readout enables, with achievement of a high conversion efficiency (amplification factor), suppression of increase in noise.

6. Usage Examples of Solid-State Image Pickup Device

Figure 22:
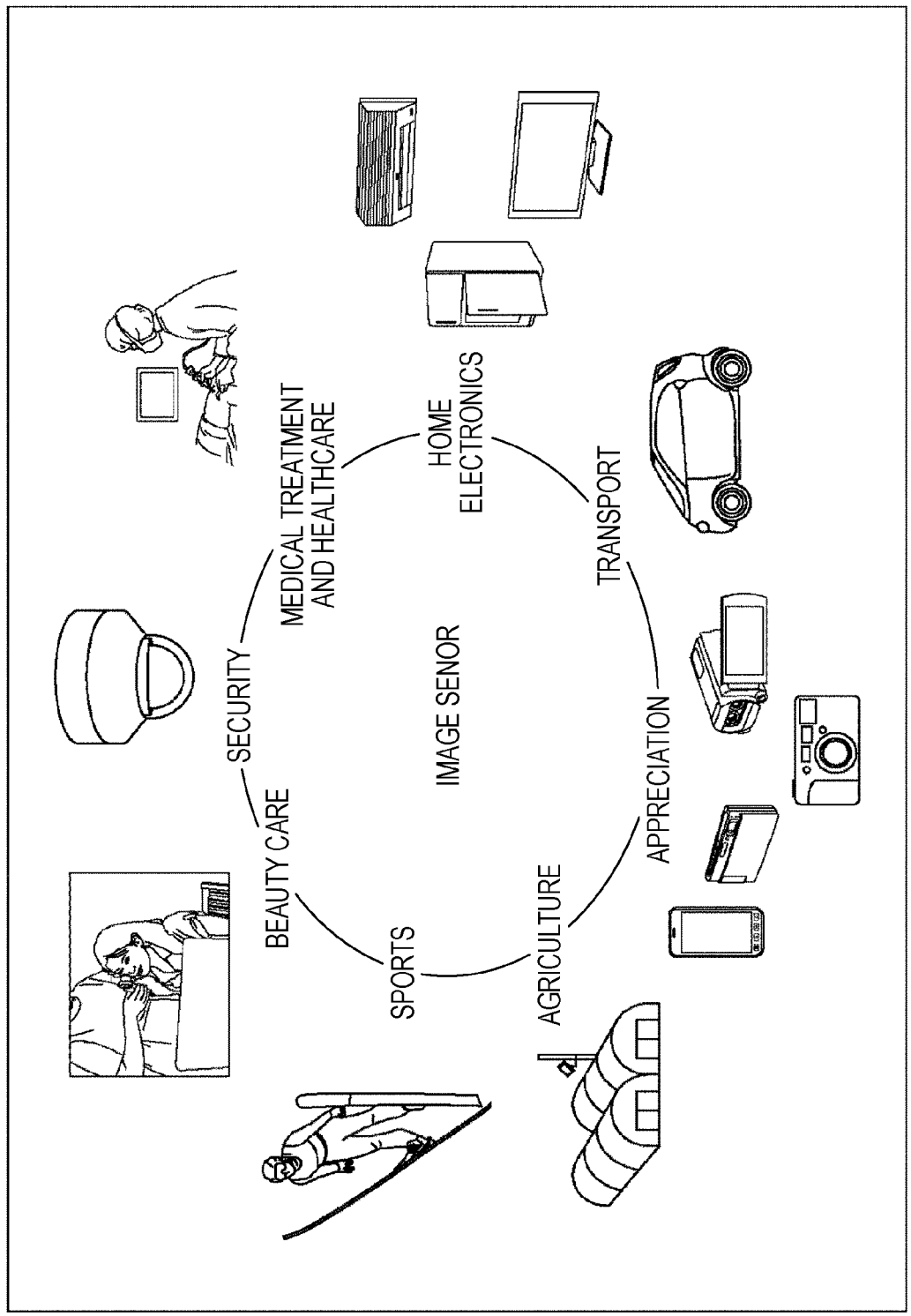
FIG. 22 illustrates usage examples of the solid-state image pickup device to which the present technology is applied.

FIG. 22 illustrates usage examples of a solid-state image pickup device to which the present technology is applied.

A CMOS image sensor 10 can be used, for example, in the following various cases where light, such as visible light, infrared light, ultraviolet light, and X rays, is sensed. That is, as illustrated in FIG. 22, the CMOS image sensor 10 can be used not only in devices for use in the field of appreciation in which an image to be provided for appreciation is shot, but also in devices for use in, for example, the field of transport, the field of home electronics, the field of medical treatment and healthcare, the field of security, the field of beauty care, the field of sports, the field of agriculture, or other fields.

Specifically, in the field of appreciation, for example, the CMOS image sensor 10 can be used in devices (e.g., the electronic apparatus 1000 of FIG. 21) that shoot an image to be provided for appreciation, such as a digital camera, a smartphone, and a mobile phone having a camera function.

In the field of transport, for example, the CMOS image sensor 10 can be used in devices to be provided for transport, such as an in-vehicle sensor that shoots the front, rear, periphery, inside of an automobile, or the like for safe driving, such as automatic stopping, or for recognition of the state of a driver, a surveillance camera that monitors traveling vehicles or roads, and a range sensor that measures, for example, the distance between vehicles.

In the field of home electronics, for example, the CMOS image sensor 10 can be used in devices to be provided for home electronics, such as a television receiver, a refrigerator, and an air conditioner, for shooting a gesture of a user and performing an apparatus operation corresponding to the gesture. Furthermore, in the field of medical treatment and healthcare, for example, the CMOS image sensor 10 can be used in devices to be provided for medical treatment or healthcare, such as an endoscope and a device that shoots blood vessels with reception of infrared light.

In the field of security, for example, the CMOS image sensor 10 can be used in devices to be provided for security, such as a surveillance camera for use in crime prevention and a camera for use in person authentification. Furthermore, in the field of beauty care, for example, the CMOS image sensor 10 can be used in devices to be provided for beauty care, such as a skin measuring instrument that shoots skin and a microscope that shoots a scalp.

In the field of sports, for example, the CMOS image sensor 10 can be used in devices to be provided for sports, such as an action camera and a wearable camera for use in sports and the like. Furthermore, in the field of agriculture, for example, the CMOS image sensor 10 can be used in devices to be provided for agriculture, such as a camera for monitoring the state of fields or crops.

7. Application to Movable Object

The technology according to the present disclosure (present technology) can be applied to various products. For example, the technology according to the present disclosure may be achieved as a device to be mounted on a movable object in any type of an automobile, an electric vehicle, a hybrid electric vehicle, a motorcycle, a bicycle, a personal transporter, an airplane, a drone, a ship, a robot, and the like.

Figure 23:
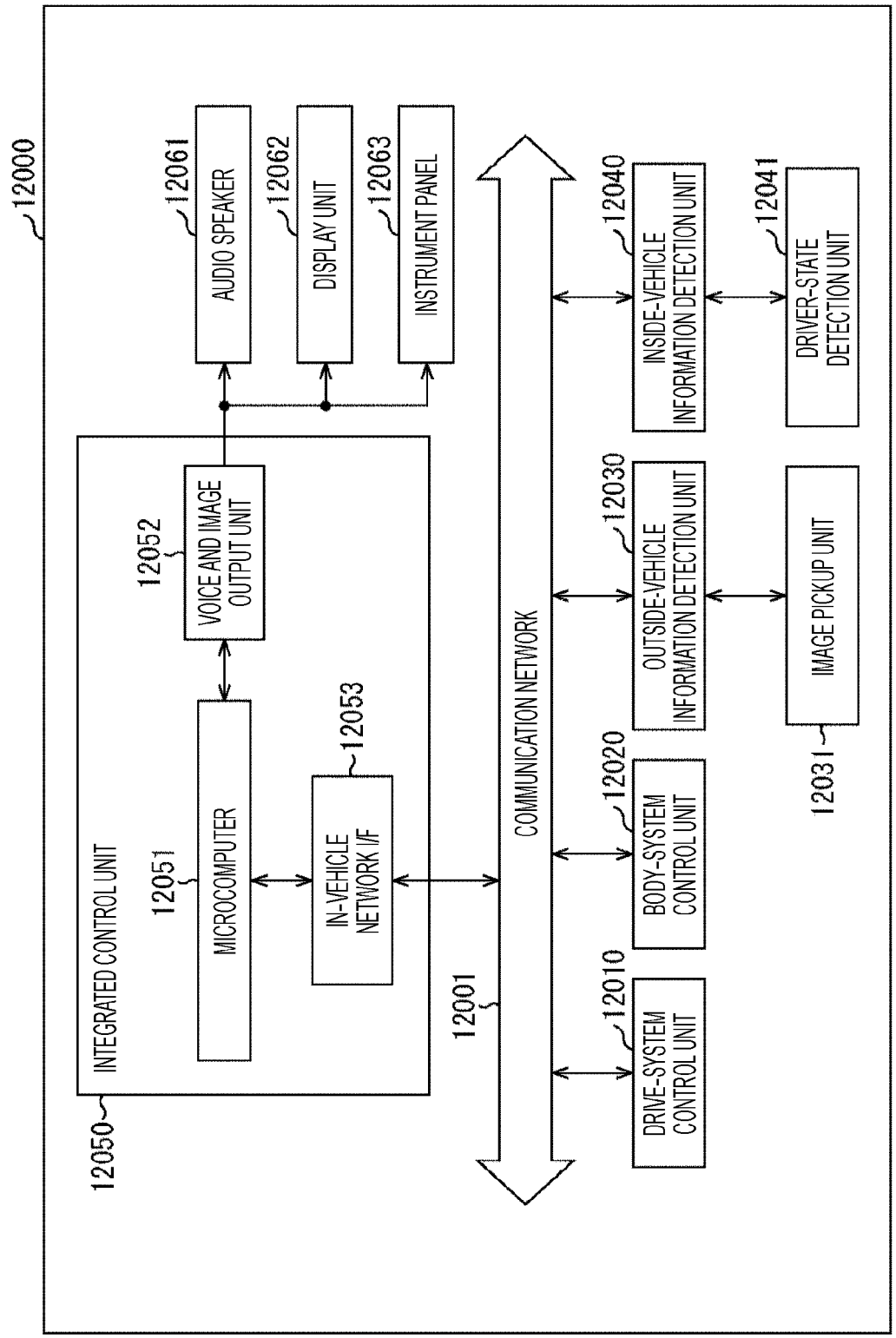
FIG. 23 is a block diagram of an exemplary schematic configuration of a vehicle control system.

FIG. 23 is a block diagram of an exemplary schematic configuration of a vehicle control system that is an exemplary movable-object control system to which the technology according to the present disclosure can be applied.

The vehicle control system 12000 includes a plurality of electronic control units connected through a communication network 12001. In the example illustrated in FIG. 23, the vehicle control system 12000 includes a drive-system control unit 12010, a body-system control unit 12020, an outside-vehicle information detection unit 12030, an inside-vehicle information detection unit 12040, and an integrated control unit 12050. Furthermore, as the functional configuration of the integrated control unit 12050, a microcomputer 12051, a voice and image output unit 12052, and an in-vehicle network interface (I/F) 12053 are illustrated.

The drive-system control unit 12010 controls the operations of devices related to the drive system of the vehicle, in accordance with various types of programs. For example, the drive-system control unit 12010 functions as a control device for a driving-force generation device that generates the driving force of the vehicle, such as an internal combustion engine or a motor for drive, a driving-force transmission mechanism for transmitting the driving force to the wheels, a steering mechanism of adjusting the rudder angle of the vehicle, a braking device that generates the breaking force of the vehicle, and the like.

The body-system control unit 12020 controls the operations of various types of devices installed on the body, in accordance with various types of programs. For example, the body-system control unit 12020 functions as a control device for a keyless entry system, a smart key system, a power window device, and various types of lamps, such as head lamps, rear lamps, brake lamps, blinkers, and fog lamps. In this case, a radio wave transmitted from a mobile device that is a substitute for the key or signals of various types of switches can be input into the body-system control unit 12020. The body-system control unit 12020 receives the input of the radio wave or each signal and then controls, for example, the door lock device, power window device, or lamps of the vehicle.

The outside-vehicle information detection unit 12030 detects information regarding the outside of the vehicle equipped with the vehicle control system 12000. For example, the outside-vehicle information detection unit 12030 is connected with an image pickup unit 12031. The outside-vehicle information detection unit 12030 causes the image pickup unit 12031 to capture an image outside the vehicle, and additionally receives the captured image. On the basis of the received image, the outside-vehicle information detection unit 12030 may perform object detection processing or distance detection processing to, for example, a person, a car, an obstruction, a sign, or characters on a road surface.

The image pickup unit 12031 is an optical sensor that receives light and outputs an electric signal corresponding to the amount of the received light. The image pickup unit 12031 is capable of outputting the electric signal as an image or as range information. Furthermore, light that the image pickup unit 12031 receives may be visible light or invisible light, such as infrared rays.

The inside-vehicle information detection unit 12040 detects information regarding the inside of the vehicle. For example, the inside-vehicle information detection unit 12040 is connected with a driver-state detection unit 12041 that detects the state of the driver. The driver-state detection unit 12041 includes, for example, a camera that captures the driver, and the inside-vehicle information detection unit 12040 may calculate the degree of fatigue or the degree of concentration of the driver or may discriminate whether or not the driver is drowsy, on the basis of detection information input from the driver-state detection unit 12041.

On the basis of information regarding the outside of the vehicle or the inside of the vehicle acquired by the outside-vehicle information detection unit 12030 or the inside-vehicle information detection unit 12040, the microcomputer 12051 computes a control target value for the driving-force generation device, the steering mechanism, or the braking device, so that a control command can be output to the drive-system control unit 12010. For example, the microcomputer 12051 is capable of performing cooperative control for achievement of the function of an advanced driver assistance system (ADAS) including, for example, collision avoidance or impact alleviation of the vehicle, follow-up travelling, speed-kept travelling, and collision warning of the vehicle, based on the inter-vehicle distance, and lane-departure warning of the vehicle.

Furthermore, the microcomputer 12051 is capable of performing cooperative control for, for example, automated driving for autonomous travelling without an operation of the driver, in which, for example, the driving-force generation device, the steering mechanism, or the braking device is controlled on the basis of information regarding the periphery of the vehicle acquired by the outside-vehicle information detection unit 12030 or the inside-vehicle information detection unit 12040.

Furthermore, on the basis of information regarding the outside of the vehicle acquired by the outside-vehicle information detection unit 12030, the microcomputer 12051 is capable of outputting a control command to the body-system control unit 12020. For example, the microcomputer 12051 is capable of performing cooperative control for antiglare achievement, in which the head lamps are controlled in accordance with the position of a vehicle ahead or an oncoming vehicle detected by the outside-vehicle information detection unit 12030 such that, for example, switching from high beam to low beam is performed.

The voice and image output unit 12052 transmits an output signal of at least one of a voice or an image, to an output device capable of notifying any occupant in the vehicle or the outside of the vehicle of information visually or aurally. In the example of FIG. 23, as the output device, an audio speaker 12061, a display unit 12062, and an instrument panel 12063 are exemplified. For example, the display unit 12062 may include at least one of an on-board display or a head-up display.

Figure 24:
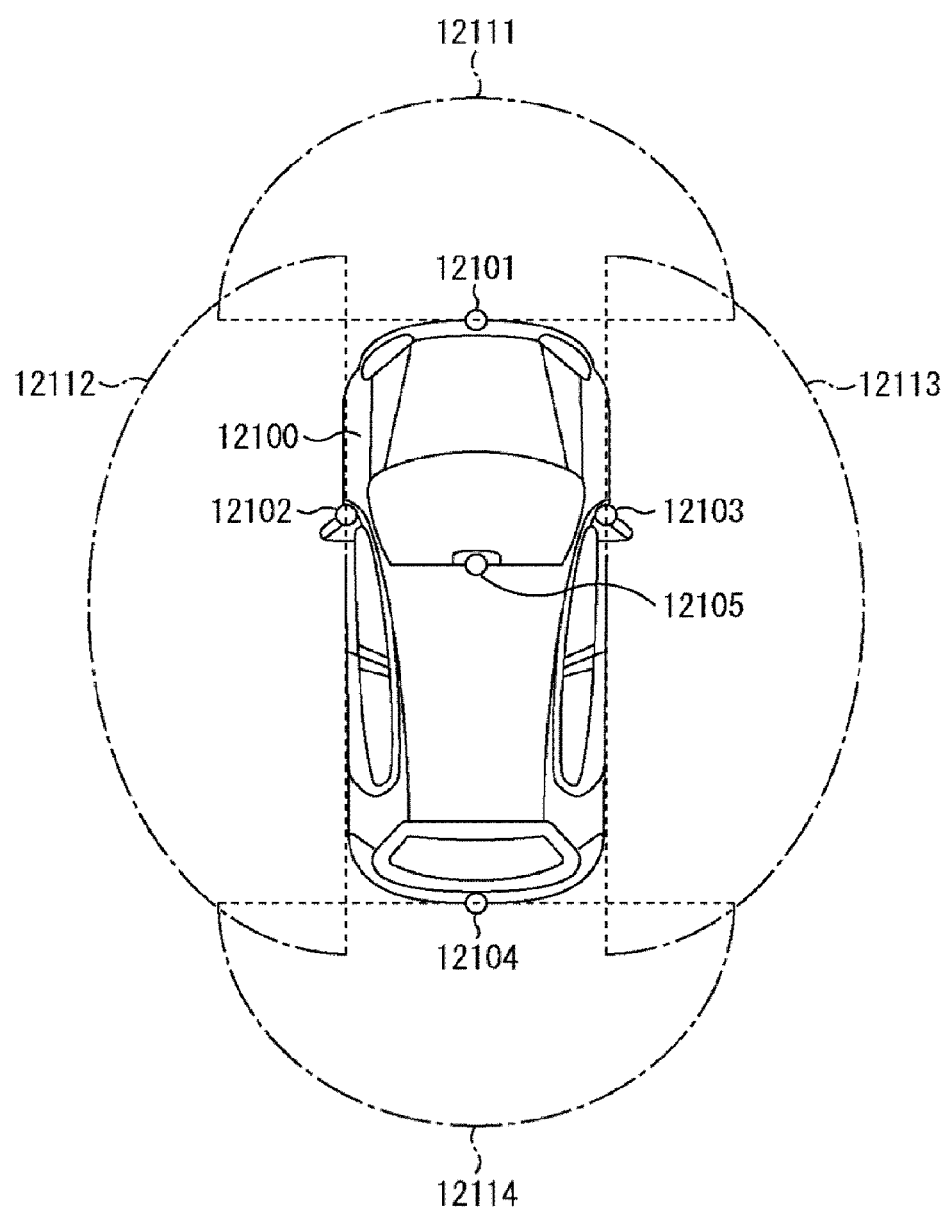
FIG. 24 is an explanatory view of exemplary installed positions of an outside-vehicle information detection unit and an image pickup unit.

FIG. 24 illustrates exemplary installed positions of the image pickup unit 12031.

In FIG. 24, as the image pickup unit 12031, provided are image pickup units 12101, 12102, 12103, 12104, and 12105.

The image pickup units 12101, 12102, 12103, 12104, and 12105 are provided in position, for example, at the front nose, sideview mirrors, rear bumper, back door, upper portion of the windshield in the room of a vehicle 12100, or the like. The image pickup unit 12101 provided at the front nose and the image pickup unit 12105 provided at the upper portion of the windshield in the room mainly acquire an image ahead of the vehicle 12100. The image pickup units 12102 and 12103 provided at the sideview mirrors mainly acquire an image lateral to the vehicle 12100. The image pickup unit 12104 provided at the rear bumper or the back door mainly acquires an image behind the vehicle 12100. The image pickup unit 12105 provided at the upper portion of the windshield in the room is mainly used in detection of, for example, a vehicle ahead, a pedestrian, an obstruction, a traffic light, a traffic sign, or a lane.

Note that FIG. 24 illustrates exemplary shooting ranges of the image pickup units 12101 to 12104. A capturing range 12111 indicates the capturing range of the image pickup unit 12101 provided at the front nose. Capturing ranges 12112 and 12113 indicate, respectively, the capturing ranges of the image pickup units 12102 and 12103 provided at the sideview mirrors. A capturing range 12114 indicates the capturing range of the image pickup unit 12104 provided at the rear bumper or the back door. For example, pieces of image data captured by the image pickup units 12101 to 12104 are overlapped, resulting in acquisition of an overhead image in which the vehicle 12100 is viewed from above.

At least one of the image pickup units 12101 to 12104 may have a function of acquiring distance information. For example, at least one of the image pickup units 12101 to 12104 may be a stereo camera including a plurality of image pickup elements or may be an image pickup element including pixels for detection of phase difference.

For example, on the basis of distance information acquired from the image pickup units 12101 to 12104, the microcomputer 12051 acquires the distance to each three-dimensional object in the capturing ranges 12111 to 12114 and the variation of the distance in time (relative speed to the vehicle 12100), so that, particularly, a three-dimensional object that is the closest on the path of travel of the vehicle 12100 and travels at a predetermined speed (e.g., 0 km/h or more) in substantially the same direction with the vehicle 12100 can be extracted as the vehicle ahead. Moreover, the microcomputer 12051 is capable of performing, for example, automated brake control (including follow-up stop control) or automated acceleration control (including follow-up start control), by setting the inter-vehicle distance to be previously secured behind the vehicle ahead. As described above, cooperative control can be performed for, for example, automated driving for autonomous traveling without an operation of the driver.

For example, on the basis of distance information acquired by the image pickup units 12101 to 12104, the microcomputer 12051 classifies three-dimensional data regarding three-dimensional objects, into two-wheeled vehicle, ordinary vehicle, large-size vehicle, pedestrian, utility pole, and other three-dimensional objects. Then, the microcomputer 12051 extracts the classified three-dimensional data for automatic avoidance of obstructions. For example, the microcomputer 12051 distinguishes obstructions in the periphery of the vehicle 12100 into the obstruction that the driver of the vehicle 12100 can visually identify and the obstruction difficult for the driver of the vehicle 12100 to visually identify. Then, the microcomputer 12051 determines collision risk indicating the degree of risk of collision with each obstruction. In a situation in which collision is likely to occur with the collision risk at a set value or more, the microcomputer 12051 outputs an alert to the driver through the audio speaker 12061 or the display unit 12062 or performs forced deceleration or avoidant steering through the drive-system control unit 12010, so that driving assistance for collision avoidance can be performed.

At least one of the image pickup units 12101 to 12104 may be an infrared camera that detects infrared rays. For example, the microcomputer 12051 determines whether or not any pedestrian is present in respective captured images of the image pickup units 12101 to 12104, so that a pedestrian can be recognized. The recognition of a pedestrian is performed through a step in which feature points are extracted from respective captured images of the image pickup units 12101 to 12104, for example, as infrared cameras and a step in which pattern matching processing is performed to a series of feature points indicating the outline of an object, to discriminate whether or not the object is a pedestrian. After the microcomputer 12051 determines that a pedestrian is present in any of the respective captured images of the image pickup units 12101 to 12104 and recognizes the pedestrian, the voice and image output unit 12052 controls the display unit 12062 such that a quadrate contour is superimposed on the recognized pedestrian for emphasis display. Furthermore, the voice and image output unit 12052 may control the display unit 12062 such that, for example, an icon indicating a pedestrian is displayed at a desired position.

An exemplary vehicle control system to which the technology according to the present disclosure can be applied has been described above. The technology according to the present disclosure can be applied to, for example, the image pickup unit 12031 in the configuration described above. Specifically, the CMOS image sensor 10 of FIG. 1 can be applied to the image pickup unit 12031. Application of the technology according to the present disclosure to the image pickup unit 12031 enables a reduction in the number of wiring lines and a reduction in the manufacturing cost of the image pickup unit 12031.

Note that the embodiments are exemplary in order to embody the present technology, and the matters in the embodiments and particular matters concerning the invention in the claims are in mutual correspondence relationship. Similarly, the particular matters concerning the invention in the claims and the matters in the embodiments of the present technology denoted with the same names as the particular matters, are in mutual correspondence relationship. Note that the present technology is not limited to the embodiments, and thus various modifications are made to the embodiments without departing from the scope of the spirit, so that the present technology can be embodied.

Note that the effects in the present specification are just exemplary and are not limitative, and thus other effects may be provided.

Note that the present technology can also have the following configurations.

(1) A solid-state image pickup element including:
an electric-charge accumulation unit configured to accumulate electric charge transferred from a photoelectric conversion unit, and generate signal voltage corresponding to an amount of the electric charge;
a reference reset transistor configured to supply predetermined reset voltage to the electric-charge accumulation unit in a case of generating predetermined reference voltage; and
a readout reset transistor configured to supply voltage different from the reset voltage to the electric-charge accumulation unit in a case of reading out the signal voltage.

(2) The solid-state image pickup element according to (1) above,
in which two reference reset transistors are provided in the each electric-charge accumulation unit, and
the two reference reset transistors are connected in series between a vertical reset input line connected with a terminal of the reset voltage and the electric-charge accumulation unit.

(3) The solid-state image pickup element according to (2) above,
in which the readout reset transistor is connected in parallel to either of the two reference reset transistors at a connection point between the two reference reset transistors.

(4) The solid-state image pickup element according to any of (1) to (3) above,
in which two readout reset transistors are provided in the each electric-charge accumulation unit, and
the two reference reset transistors are connected in series between a vertical reset input line connected with a terminal of the reset voltage and the electric-charge accumulation unit.

(5) The solid-state image pickup element according to any of (1) to (4) above,
in which the electric-charge accumulation unit, the reference reset transistor, and the readout reset transistor are arranged in each of a pair of pixels arrayed in a vertical direction orthogonal to a predetermined direction,
the respective reference reset transistors of the pair of pixels are both connected with a vertical reset input line arranged in the vertical direction,
the readout reset transistor in one of the pair of pixels is connected with one of a pair of vertical signal lines arranged in the vertical direction,
the readout reset transistor in another one of the pair of pixels is connected with another one of the pair of vertical signal lines,
the vertical reset input line is connected with a terminal of the reset voltage, and
the pair of vertical signal lines is connected to a terminal of power-source voltage through a current mirror circuit.

(6) The solid-state image pickup element according to (5) above,
in which the pair of pixels each further includes:
a transfer transistor configured to transfer the electric charge from the photoelectric conversion unit to the electric-charge accumulation unit, in accordance with a transfer signal;
an amplification transistor configured to amplify the signal voltage; and
a selection transistor configured to output the amplified signal voltage to the vertical signal line, in accordance with a selection signal.

(7) The solid-state image pickup element according to (6) above,
in which the readout reset transistor connects a connection node between a corresponding vertical signal line from the pair of vertical signal lines and the selection transistor to the electric-charge accumulation unit.

(8) The solid-state image pickup element according to (6) above,
in which the readout reset transistor connects a connection node between the selection transistor and the amplification transistor to the electric-charge accumulation unit.

(9) The solid-state image pickup element according to any of (6) to (8) above, further including
a vertical drive unit configured to drive each of the pair of pixels in sequence to read out the signal voltage.

(10) The solid-state image pickup element according to (9) above,
in which the vertical drive unit selects a pair of lines adjacent to each other from a plurality of lines each including pixels arrayed in the predetermined direction, and reads out the signal voltage in sequence from both of the pair of lines.

(11) The solid-state image pickup element according to (9) above,
in which the vertical drive unit reads out the signal voltage from any of a plurality of lines each including pixels arrayed in the predetermined direction, and causes generation of the reference voltage in a line at a predetermined relative position to the corresponding line.

(12) An electronic apparatus including: an electric-charge accumulation unit configured to accumulate electric charge transferred from a photoelectric conversion unit, and generate signal voltage corresponding to an amount of the electric charge;

a reference reset transistor configured to supply predetermined reset voltage to the electric-charge accumulation unit in a case of generating predetermined reference voltage;

a readout reset transistor configured to supply voltage different from the reset voltage to the electric-charge accumulation unit in a case of reading out the signal voltage; and a signal processing unit configured to process a signal of the signal voltage.

(13) A method of controlling a solid-state image pickup element, the method including:

a reference reset step of supplying, in a case of generating predetermined reference voltage, predetermined reset voltage to an electric-charge accumulation unit that accumulates electric charge transferred from a photoelectric conversion unit and generates signal voltage corresponding to an amount of the electric charge; and a readout reset step of supplying, in a case of reading out the signal voltage, voltage different from the reset voltage to the electric-charge accumulation unit.

REFERENCE SIGNS LIST

10 CMOS image sensor
11 Pixel array unit
12 Vertical drive unit
13 Column readout circuit unit
14 Column signal processing unit
15 Horizontal drive unit
16 System control unit
17 Signal processing unit
18 Data storage unit
210, 220 Pixel
211, 221 Photodiode
212, 222 Transfer transistor
213, 223, 218, 228 Reference reset transistor
214, 224, 219, 229 Readout reset transistor
215, 225 Floating diffusion region
216, 226 Selection transistor
217, 227 Amplification transistor
300 Unit readout circuit
311, 312 P-type transistor
313 to 323 Switch
324 Current source
410 ADC
411 Comparator
412 Counter
420 Output unit
12031 Image pickup unit

The invention claimed is:

1. A solid-state image pickup element comprising:
a floating diffusion region configured to accumulate electric charge transferred from a photoelectric conversion unit, and generate a signal voltage corresponding to an amount of the electric charge;
a reference reset transistor configured to supply predetermined reset voltage to the floating diffusion region in a case of generating a predetermined reference voltage; and
a readout reset transistor configured to supply voltage different from the reset voltage to the floating diffusion region in a case of reading out the signal voltage, wherein the floating diffusion region, the reference reset transistor, and the readout reset transistor are arranged in each of a pair of pixels arrayed in a vertical direction orthogonal to a predetermined direction, the respective reference reset transistors of the pair of pixels are both connected with a vertical reset input line arranged in the vertical direction, the readout reset transistor in one of the pair of pixels is connected with one of a pair of vertical signal lines arranged in the vertical direction, the readout reset transistor in another one of the pair of pixels is connected with another one of the pair of vertical signal lines, the vertical reset input line is connected with a terminal of the reset voltage, and the pair of vertical signal lines is connected to a terminal of power-source voltage through a current mirror circuit.

2. The solid-state image pickup element according to claim 1,
wherein two reference reset transistors are provided in each floating diffusion region, and
the two reference reset transistors are connected in series between a vertical reset input line connected with a terminal of the reset voltage and the floating diffusion region.

3. The solid-state image pickup element according to claim 2,
wherein the readout reset transistor is connected in parallel to either of the two reference reset transistors at a connection point between the two reference reset transistors.

4. The solid-state image pickup element according to claim 1,
wherein two readout reset transistors are provided in each floating diffusion region, and
the two readout reset transistors are connected in series between a vertical reset input line connected with a terminal of the reset voltage and the floating diffusion region.

5. The solid-state image pickup element according to claim 1,
wherein the pair of pixels each further includes:
a transfer transistor configured to transfer the electric charge from the photoelectric conversion unit to the floating diffusion region, in accordance with a transfer signal;
an amplification transistor configured to amplify the signal voltage; and
a selection transistor configured to output the amplified signal voltage to the vertical signal line, in accordance with a selection signal.

6. The solid-state image pickup element according to claim 5,
wherein the readout reset transistor connects a connection node between a corresponding vertical signal line from the pair of vertical signal lines and the selection transistor to the floating diffusion region.

7. The solid-state image pickup element according to claim 5,
wherein the readout reset transistor connects a connection node between the selection transistor and the amplification transistor to the floating diffusion region.

8. The solid-state image pickup element according to claim 5, further comprising
pixel drive circuitry configured to drive each of the pair of pixels in sequence to read out the signal voltage.

9. The solid-state image pickup element according to claim 8,
wherein the pixel drive circuitry selects a pair of lines adjacent to each other from a plurality of lines each including pixels arrayed in the predetermined direction, and reads out the signal voltage in sequence from both of the pair of lines.

10. The solid-state image pickup element according to claim 8,
wherein the pixel drive circuitry reads out the signal voltage from any of a plurality of lines each including pixels arrayed in the predetermined direction, and causes generation of the reference voltage in a line at a predetermined relative position to the corresponding line.

11. An electronic apparatus comprising:
a floating diffusion region configured to accumulate electric charge transferred from a photoelectric conversion unit, and generate a signal voltage corresponding to an amount of the electric charge;
a reference reset transistor configured to supply predetermined reset voltage to the floating diffusion region in a case of generating a predetermined reference voltage;
a readout reset transistor configured to supply voltage different from the reset voltage to the floating diffusion region in a case of reading out the signal voltage; and
signal processing circuitry configured to process a signal of the signal voltage, wherein the floating diffusion region, the reference reset transistor, and the readout reset transistor are arranged in each of a pair of pixels arrayed in a vertical direction orthogonal to a predetermined direction,
the respective reference reset transistors of the pair of pixels are both connected with a vertical reset input line arranged in the vertical direction,
the readout reset transistor in one of the pair of pixels is connected with one of a pair of vertical signal lines arranged in the vertical direction,
the readout reset transistor in another one of the pair of pixels is connected with another one of the pair of vertical signal lines,
the vertical reset input line is connected with a terminal of the reset voltage, and
the pair of vertical signal lines is connected to a terminal of power-source voltage through a current mirror circuit.

12. The electronic apparatus according to claim 11,
wherein the pair of pixels each further includes:
a transfer transistor configured to transfer the electric charge from the photoelectric conversion unit to the floating diffusion region, in accordance with a transfer signal;
an amplification transistor configured to amplify the signal voltage; and
a selection transistor configured to output the amplified signal voltage to the vertical signal line, in accordance with a selection signal.

13. The electronic apparatus according to claim 12,
wherein the readout reset transistor connects a connection node between a corresponding vertical signal line from the pair of vertical signal lines and the selection transistor to the floating diffusion region.

14. The electronic apparatus according to claim 12,
wherein the readout reset transistor connects a connection node between the selection transistor and the amplification transistor to the floating diffusion region.

15. The electronic apparatus according to claim 12, further comprising
pixel drive circuitry configured to drive each of the pair of pixels in sequence to read out the signal voltage.

16. The electronic apparatus according to claim 15,
wherein the pixel drive circuitry selects a pair of lines adjacent to each other from a plurality of lines each including pixels arrayed in the predetermined direction, and reads out the signal voltage in sequence from both of the pair of lines.

17. The electronic apparatus according to claim 15,
wherein the pixel drive circuitry reads out the signal voltage from any of a plurality of lines each including pixels arrayed in the predetermined direction, and causes generation of the reference voltage in a line at a predetermined relative position to the corresponding line.

18. The electronic apparatus according to claim 11,
wherein two reference reset transistors are provided in each floating diffusion region, and
the two reference reset transistors are connected in series between a vertical reset input line connected with a terminal of the reset voltage and the floating diffusion region.

19. A method of controlling a solid-state image pickup element, the method comprising:
a reference reset step of supplying, with a reference reset transistor, in a case of generating a predetermined reference voltage, the predetermined reset voltage to a floating diffusion region that accumulates electric charge transferred from a photoelectric conversion unit and generates a signal voltage corresponding to an amount of the electric charge; and
a readout reset step of supplying, with a readout reset transistor in a case of reading out the signal voltage, voltage different from the reset voltage to the floating diffusion region, wherein the floating diffusion region, the reference reset transistor, and the readout reset transistor are arranged in each of a pair of pixels arrayed in a vertical direction orthogonal to a predetermined direction,
the respective reference reset transistors of the pair of pixels are both connected with a vertical reset input line arranged in the vertical direction,
the readout reset transistor in one of the pair of pixels is connected with one of a pair of vertical signal lines arranged in the vertical direction,
the readout reset transistor in another one of the pair of pixels is connected with another one of the pair of vertical signal lines,
the vertical reset input line is connected with a terminal of the reset voltage, and
the pair of vertical signal lines is connected to a terminal of power-source voltage through a current mirror circuit.

* * * * *